United States Patent [19]
Ide et al.

[11] Patent Number: 5,923,219
[45] Date of Patent: Jul. 13, 1999

[54] AUTOMATIC THRESHOLD CONTROL CIRCUIT AND SIGNAL AMPLIFYING CIRCUIT FOR AMPLIFYING SIGNALS BY COMPENSATING FOR LOW-FREQUENCY RESPONSE OF PHOTODETECTOR

[75] Inventors: Satoshi Ide, Kawasaki; Takaya Chiba, Sapporo, both of Japan

[73] Assignee: Fujitsu Limited, Kawasaki, Japan

[21] Appl. No.: 08/912,688

[22] Filed: Aug. 18, 1997

[30] Foreign Application Priority Data

Mar. 19, 1997 [JP] Japan .................................. 9-066294

[51] Int. Cl.$^6$ .................................................. H03F 17/00
[52] U.S. Cl. .......................... 330/308; 330/59; 359/189; 250/214 A; 327/62; 327/70; 327/90
[58] Field of Search ............................ 330/11, 59, 308; 327/59, 62, 70, 90; 359/189; 375/317; 250/214 A

[56] References Cited

U.S. PATENT DOCUMENTS 5,475,342   12/1995   Nakamura et al. ..................... 330/136

*Primary Examiner*—James B. Mullins
*Attorney, Agent, or Firm*—Staas & Halsey, LLP

[57] ABSTRACT

An automatic threshold control circuit includes a bottom detection circuit, a relative peak detection circuit, and a voltage divider circuit. The bottom detection circuit detects an absolute minimum level of an input signal, and the relative peak detection circuit detects, in accordance with the input signal, a maximum level relative to the minimum level detected by the absolute bottom detection circuit. Further, the voltage divider circuit generates a threshold level by dividing the absolute minimum level and the relative maximum level in a predetermined ratio. Using this configuration, a signal amplifying circuit can be constructed that is capable of accurately reproducing digital signals at all times regardless of variations in the amplitude or the DC level of the input signal.

47 Claims, 31 Drawing Sheets

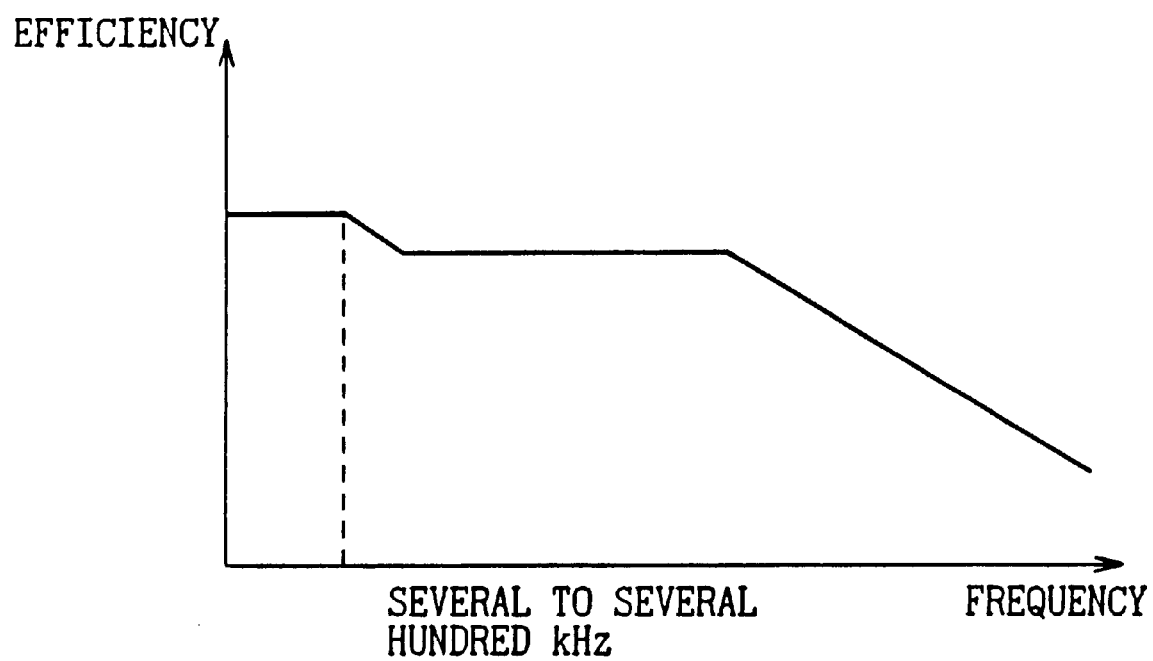

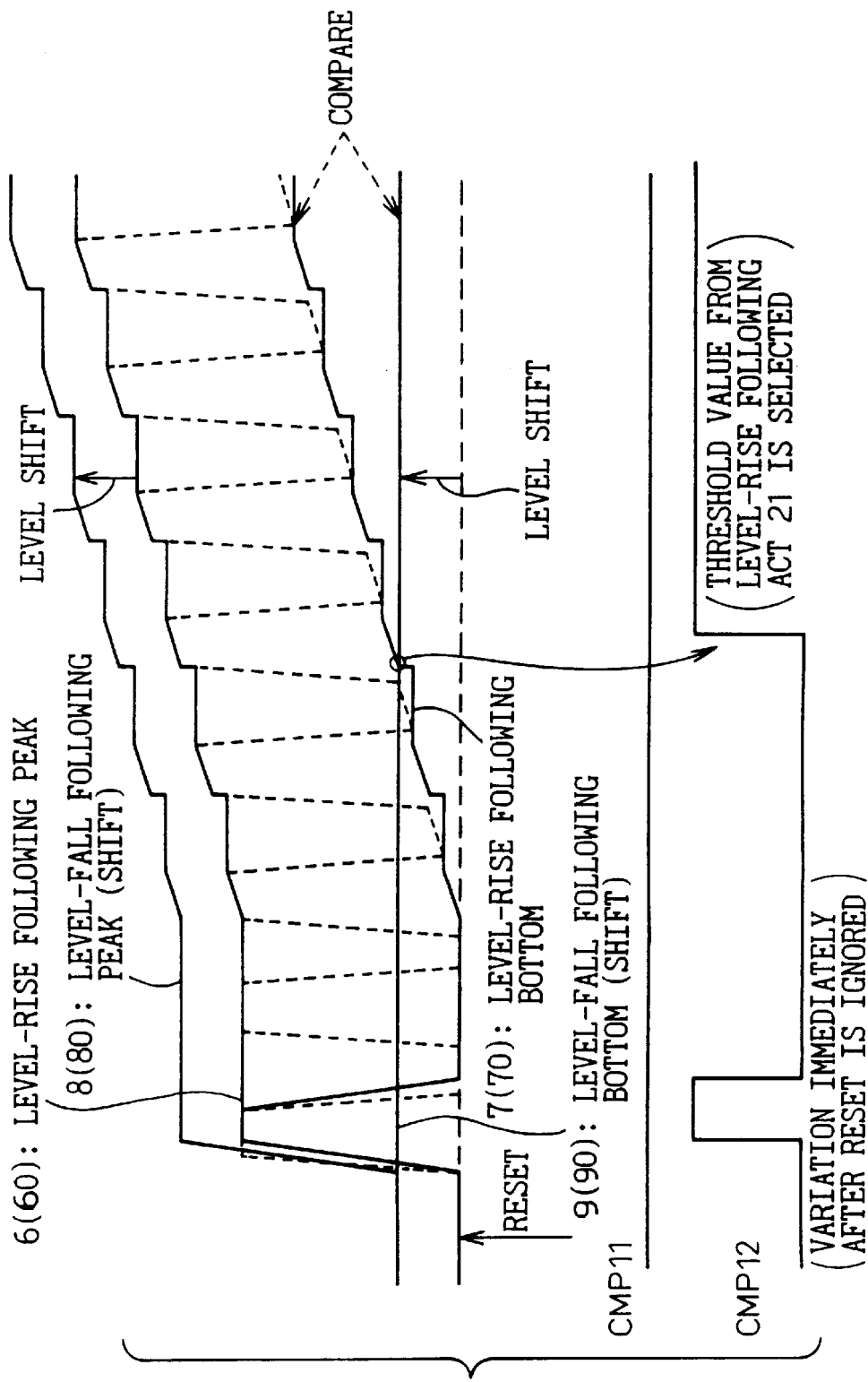

AUTOMATIC THRESHOLD CONTROL CIRCUIT AND SIGNAL AMPLIFYING CIRCUIT FOR AMPLIFYING SIGNALS BY COMPENSATING FOR LOW-FREQUENCY RESPONSE OF PHOTODETECTOR

BACKGROUND OF THE INVENTION

1. Field of the Invention

The present invention relates to an automatic threshold control circuit and a signal amplifying circuit, and more particularly, to an automatic threshold control circuit and a signal amplifying circuit for amplifying signals by compensating for the low-frequency response of a photodetector in an optical receiver circuit.

2. Description of the Related Art

In the prior art, two factors have posed problems in a signal amplifying circuit (digital signal reproduction circuit). Namely, the first problem has been the variation of signal amplitude with time, due to factors such as variations in the conditions of signal transmission channels (wired signal transmission channels using metal wires or optical fiber, and wireless transmission channels using electrical or light waves), and the second problem has been the variation in the low-frequency component, i.e., DC (direct current) level, of the signal caused by slow variations in temperature, supply voltage, and the like.

Note that these variations, if left uncontrolled, may cause the discrimination threshold level to deviate outside the amplitude range of the input signal as time elapses, eventually rendering signal reproduction impossible. One possible measure to counter these variations may be to employ differential transmission using complementary signals. However, differential transmission requires twice the number of interconnecting wires, interface circuits, and the like, and therefore the cost becomes high.

In the prior art, one possible method to address the first problem is to detect the signal amplitude and to make a logic decision on the signal level ("1" or "0") by using a threshold level set at the center of the signal amplitude.

Further, in the prior art, to address the second problem, so-called AC (alternating current) coupling has often been used that removes a DC component of an input signal through a coupling capacitor.

However, the recent trend is toward integrating circuits (on a single chip), and since there is a limit to the size of a capacitor that can be formed within a semiconductor chip, it is extremely difficult to fabricate a coupling capacitor capable of providing a sufficient low cut-off frequency within a semiconductor chip; on the other hand, using a discrete component such as a coupling capacitor would lead to increased cost. Furthermore, in the case of a symbol sequence where there is no guarantee that the average value of the input signal is ½, there arises the problem that the AC coupling cannot be used.

To address the above-outlined problems, it is desired to provide a signal amplifying circuit (digital signal reproduction circuit) that uses DC coupling which does not use a coupling capacitor, and that is capable of properly accommodating variations both in the amplitude and the DC level of an input signal.

The prior art automatic threshold control circuits and signal amplifying circuits and the problems associated with the prior art will be described in detail later with reference to the drawings.

SUMMARY OF THE INVENTION

An object of the present invention is to provide a signal amplifying circuit that can accurately reproduce digital signals at all times without being affected by variations in the signal amplitude or the DC level of an input signal.

According to the present invention, there is provided an automatic threshold control circuit comprising an absolute peak detection circuit for detecting an absolute maximum level of an input signal; a relative bottom detection circuit for detecting, in accordance with the input signal, a minimum level relative to the maximum level detected by the absolute peak detection circuit; and a voltage divider circuit for generating a threshold level by dividing the absolute maximum level and the relative minimum level in a predetermined ratio.

Further, according to the present invention, there is provided an automatic threshold control circuit comprising an absolute peak detection circuit for detecting an absolute maximum level of an input signal; a voltage divider circuit for generating a divided voltage signal by dividing the absolute maximum level, detected by the absolute peak detection circuit, and the input signal in a predetermined ratio; and a relative bottom detection circuit for generating, in accordance with the divided voltage signal, a threshold level from a minimum level relative to the absolute maximum level detected by the absolute peak detection circuit.

In the relative bottom detection circuit, a reference terminal of a capacitor for holding the relative minimum level may be connected to an output terminal of the absolute peak detection circuit. In the absolute peak detection circuit, a reference terminal of a capacitor for holding the absolute maximum level may be connected to a prescribed reference level line.

According to the present invention, there is provided an automatic threshold control circuit comprising an absolute bottom detection circuit for detecting an absolute minimum level of an input signal; a relative peak detection circuit for detecting, in accordance with the input signal, a maximum level relative to the minimum level detected by the absolute bottom detection circuit; and a voltage divider circuit for generating a threshold level by dividing the absolute minimum level and the relative maximum level in a predetermined ratio.

Further, according to the present invention, there is provided an automatic threshold control circuit comprising an absolute bottom detection circuit for detecting an absolute minimum level of an input signal; a voltage divider circuit for generating a divided voltage signal by dividing the absolute minimum level, detected by the absolute bottom detection circuit, and the input signal in a predetermined ratio; and a relative peak detection circuit for generating, in accordance with the divided voltage signal, a threshold level from a maximum level relative to the absolute minimum level detected by the absolute bottom detection circuit.

In the relative peak detection circuit, a reference terminal of a capacitor for holding the relative maximum level may be connected to an output terminal of the absolute bottom detection circuit. In the absolute bottom detection circuit, a reference terminal of a capacitor for holding the absolute minimum level may be connected to a prescribed reference level line.

According to the present invention, there is provided a signal amplifying circuit having any one of the above automatic threshold control circuits and a reproduction circuit for discriminating an input signal by using a threshold level supplied from the automatic threshold control circuit.

According to the present invention, there is also provided a signal amplifying circuit comprising a level-rise following automatic threshold control circuit which follows a rise in an input signal; a level-fall following automatic threshold control circuit which follows a fall in the input signal; a discrimination circuit which performs discrimination between a rise and a fall in a DC level of the input signal, based on detection levels from the level-rise following automatic threshold control circuit and the level-fall following automatic threshold control circuit; a selection circuit which selects a threshold level generated by the level-rise following automatic threshold control circuit or the level-fall following automatic threshold control circuit, in accordance with an output from the discrimination circuit; and a reproduction circuit which discriminates the input signal by using the threshold level.

The level-rise following automatic threshold control circuit may comprise an absolute peak detection circuit for detecting an absolute maximum level of the input signal; a relative bottom detection circuit for detecting, in accordance with the input signal, a minimum level relative to the maximum level detected by the absolute peak detection circuit; and a voltage divider circuit for generating the threshold level by dividing the absolute maximum level and the relative minimum level in a predetermined ratio. Further, the level-rise following automatic threshold control circuit may comprise an absolute peak detection circuit for detecting an absolute maximum level of the input signal; a voltage divider circuit for generating a divided voltage signal by dividing the absolute maximum level, detected by the absolute peak detection circuit, and the input signal in a predetermined ratio; and a relative bottom detection circuit for generating, in accordance with the divided voltage signal, the threshold level from a minimum level relative to the absolute maximum level detected by the absolute peak detection circuit.

The level-fall following automatic threshold control circuit may comprise an absolute bottom detection circuit for detecting an absolute minimum level of the input signal; a relative peak detection circuit for detecting, in accordance with the input signal, a maximum level relative to the minimum level detected by the absolute bottom detection circuit; and a voltage divider circuit for generating the threshold level by dividing the absolute minimum level and the relative maximum level in a predetermined ratio. Further, the level-fall following automatic threshold control circuit may comprise an absolute bottom detection circuit for detecting an absolute minimum level of the input signal; a voltage divider circuit for generating a divided voltage signal by dividing the absolute minimum level, detected by the absolute bottom detection circuit, and the input signal in a predetermined ratio; and a relative peak detection circuit for generating, in accordance with the divided voltage signal, the threshold level from a maximum level relative to the absolute minimum level detected by the absolute bottom detection circuit.

The discrimination circuit may comprise a comparator for comparing peak detection outputs of the level-rise following automatic threshold control circuit and the level-fall following automatic threshold control circuit, and wherein, when the output level of the level-rise following automatic threshold control circuit is higher than the output level of the level-fall following automatic threshold control circuit by more than a predetermined level, it may be determined that the DC level is falling. The discrimination circuit may comprise a comparator for comparing bottom detection outputs of the level-rise following automatic threshold control circuit and the level-fall following automatic threshold control circuit, wherein, when the output level of the level-fall following automatic threshold control circuit is lower than the output level of the level-rise following automatic threshold control circuit by more than a predetermined level, it may be determined that the DC level is rising. The discrimination circuit may comprise an A/D conversion circuit for digitizing peak and bottom detection levels or threshold levels supplied from the level-rise following automatic threshold control circuit and the level-fall following automatic threshold control circuit, and a logic operation circuit for comparing the digitized detection levels.

The signal amplifying circuit may further comprise a photodetector for converting an optical signal into an electric current signal, and a preamplifier for amplifying the electric current signal as a voltage signal, wherein signal amplification may be performed by taking the voltage signal as an input signal.

BRIEF DESCRIPTION OF THE DRAWINGS

The present invention will be more clearly understood from the description of the preferred embodiments as set forth below with reference to the accompanying drawings, wherein:

FIG. 5 is a diagram showing one example of the frequency response characteristic of a photodetector used in the optical receiver circuit;

FIG. 30 is a diagram for explaining a modified example of the operation of the signal amplifying circuit (in the case of a level rise) shown in FIGS. 29A and 29B;

DESCRIPTION OF THE PREFERRED EMBODIMENTS

Before describing the preferred embodiments of automatic threshold control circuits and signal amplifying circuits according to the present invention, automatic threshold control circuits and signal amplifying circuits according to the prior art and problems associated with the prior art will be described, with reference to FIGS. 1 to 8.

Figure 1:
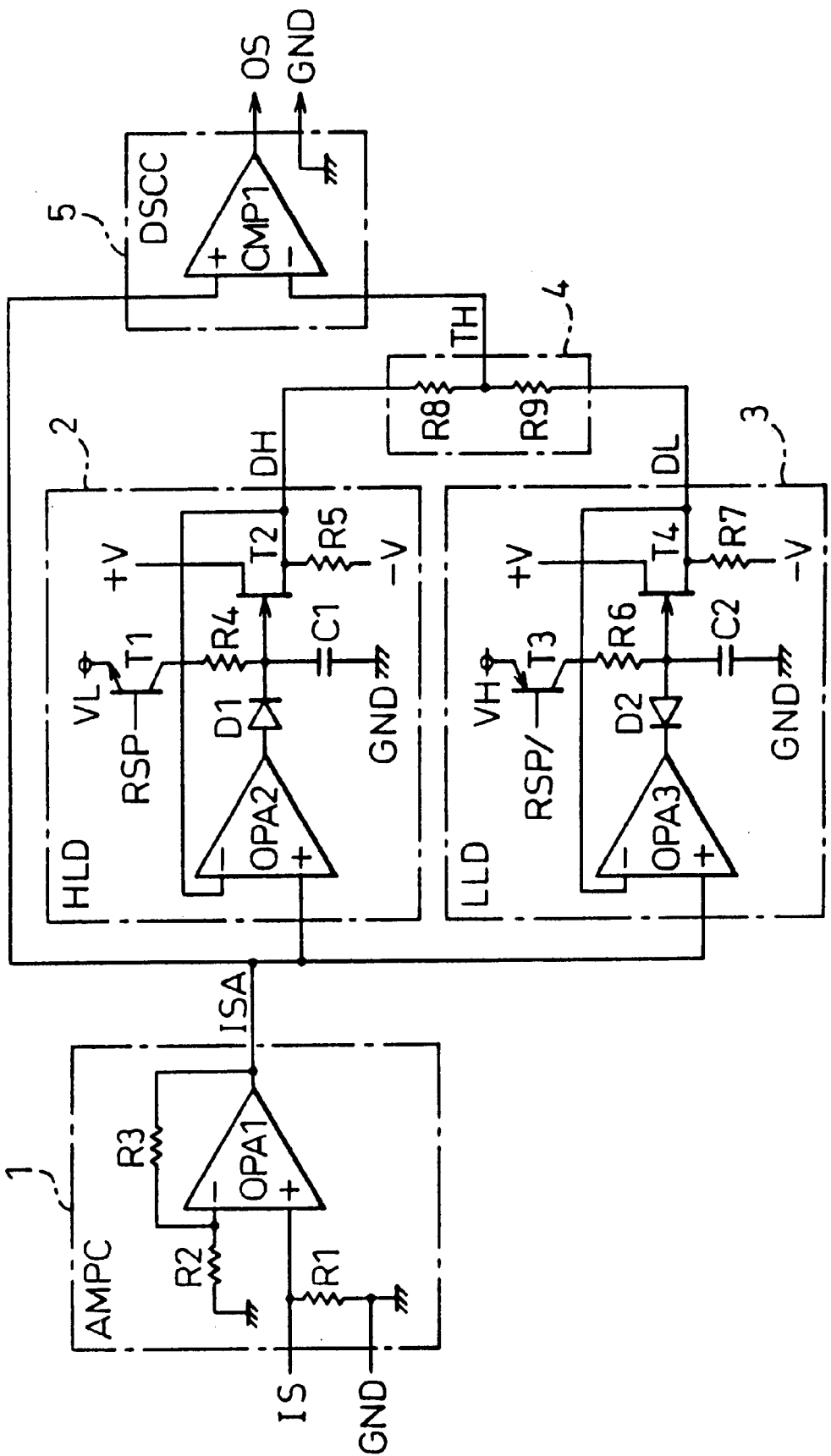
FIG. 1 is a circuit diagram showing one example of a prior art signal amplifying circuit.

FIG. 1 is a diagram showing one configurational example of the prior art signal amplifying circuit. In the figure, reference numeral 1 is an amplifying circuit (AMPC), 2 is a peak detection circuit (HLD), 3 is a bottom detection circuit (LLD), 4 is a resistor voltage divider circuit (VD), and 5 is a reproduction circuit (DSCC).

The amplifying circuit 1 is configured as a DC-coupled, noninverting amplifier using a wide-band operational amplifier, which amplifies a weak input signal IS and outputs an amplified (input) signal ISA of appropriate amplitude and DC level. In the peak detection circuit 2, one end (reference side) of a capacitor C1 for detecting and holding a maximum level of the input signal ISA is connected to ground, and the peak detection circuit 2 detects and holds an absolute maximum level DH of the input signal ISA.

Next, the operation of the peak detection circuit 2 will be described in detail.

In the initialized condition of the peak detection circuit 202, an npn bipolar transistor T1 is caused to conduct by a positive reset pulse RSP that occurs, for example, during the interval when the input signal ISA=0 (corresponding to a logic low level), and the capacitor C1 is discharged toward a prescribed bias low level VL. A field-effect transistor (N-channel MOSFET) T2 having a high input impedance forms a source follower circuit, and outputs the signal DH at low impedance, whose potential is approximately equal to the discharge potential of the capacitor C1.

Strictly, the output signal DH of the field-effect transistor T2 is different from the potential of the capacitor C1 by a voltage equal to the threshold voltage of the field-effect transistor T2, but in the description below, this difference is ignored for simplicity.

On the other hand, an operational amplifier OPA2 compares the input signal ISA with the output signal DH, and when ISA>DH, rapidly charges the capacitor C1 through a diode D1. With the discharging by the transistor T1 and the charging by the operational amplifier OPA2, the output signal DH at initialization is thus finally brought to a level equal to the signal level of the input signal ISA=0 at that time.

After the above initialization, when the input signal next changes to 1 (corresponding to a logic high level), ISA>DH, and hence the capacitor C1 is rapidly charged until the output signal DH is brought to the signal level of the input signal=1. That is, the peak detection level DH is raised to the signal level of ISA=1.

Thereafter, this peak detection level DH rises to the signal level of the ISA at each instant in time as long as the relation ISA>DH is satisfied, regardless of variations in the amplitude or the DC level of the input signal ISA.

The same applies to the bottom detection circuit 3; that is, at first its bottom detection level DL is initialized to the signal level at the time of resetting, i.e., ISA=0, and thereafter, lowers to the signal level of the input signal ISA at each instant in time as long as the relation ISA<DL is satisfied.

The resistor voltage divider circuit 4 consists of resistors R8 and R9 with equal resistance values, and outputs a threshold level TH=(DH+DL)/2 which corresponds to a value just at the midpoint between the peak detection level DH and the bottom detection level DL.

The reproduction circuit 5 comprises a comparator COMP1, which produces an output signal OS=1 (logic 1 level) when ISA>TH, and an output signal OS=0 (logic 0 level) when ISA≦TH.

In this way, the prior art signal amplifying circuit automatically sets its threshold level TH at a point halfway between the peak detection level DH and the bottom detection level DL. This configuration is effective in addressing the amplitude variation of the input signal ISA.

However, since the prior art signal amplifying circuit shown in FIG. 1 employs a DC coupling system, not only the amplitude but also the DC level of the input signal ISA varies due to the effects of variations in signal transmission channel characteristics, temperature or supply voltage, etc. Thus, the prior art signal amplifying circuit has had a problem, yet to be resolved that the threshold level TH deviates from the center value of the amplitude of the input signal ISA. This will be explained in detail below.

Figure 2:
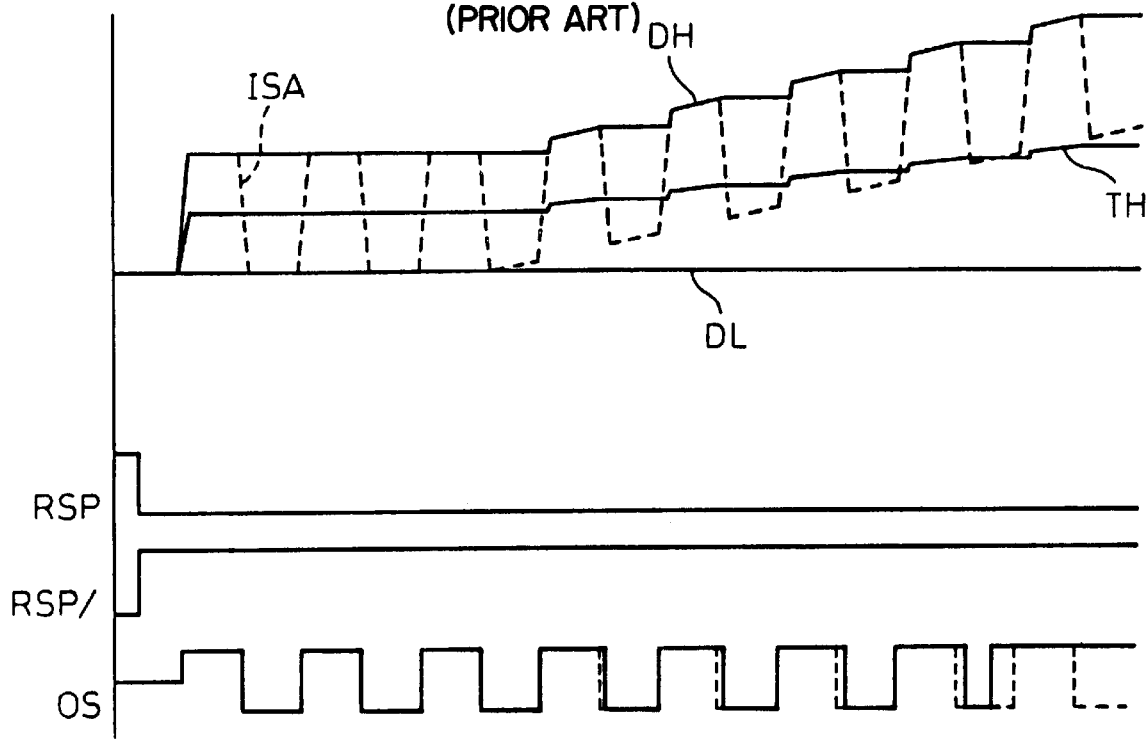
FIG. 2 is a diagram (part 1) for explaining the problem involved in the prior art signal amplifying circuit shown in FIG. 1.
Figure 3:
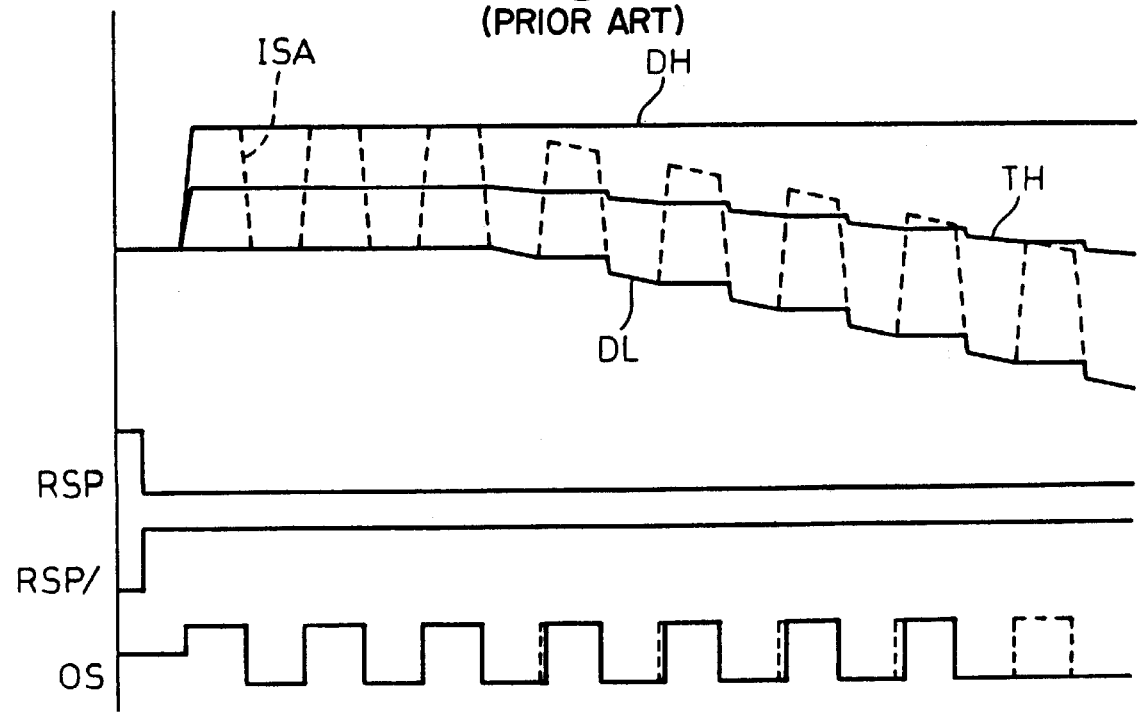
FIG. 3 is a diagram (part 2) for explaining the problem involved in the prior art signal amplifying circuit shown in FIG. 1.

FIG. 2 is a diagram (part 1) for explaining the problem involved in the prior art signal amplifying circuit shown in FIG. 1, and FIG. 3 is a diagram (part 2) for explaining the problem involved with the prior art signal amplifying circuit shown in FIG. 1. More specifically, FIG. 2 shows the case where the DC level of the input signal ISA rises at some intermediate point in time, while FIG. 3 shows the case where the DC level of the input signal ISA drops at some intermediate point in time.

In FIG. 2, during the period when the DC level of the input signal ISA is constant, the threshold level TH is approximately at the center of the signal amplitude of the input signal ISA.

However, when the DC level of the input signal ISA begins to rise, the peak detection level DH of the peak detection circuit 2 satisfies the relation ISA>DH and therefore rises by quickly following the rise of the DC level, while on the other hand, the bottom detection level DL of the bottom detection circuit 3 remains at the initial bottom detection level DL. As a result, the rise of the intermediate threshold level TH {=(DH+DL)/2} is sluggish, as shown, gradually deviating from the center of the signal amplitude of the input signal ISA. This causes the pulse width of the output signal OS to spread, and in the worst case, it becomes impossible to discriminate the state of the input signal ISA=0.

In the above initialization, ISA becomes approximately equal to TH, and furthermore, noise, etc. exist in a practical situation, so that the logic 1 and 0 levels of the output signal OS are indefinite. In FIG. 2, this state is shown by an intermediate level between the logic 1 and 0. The same applies to the description given hereinafter.

In FIG. 3, during the period when the DC level of the input signal ISA is constant, the threshold level TH is approximately at the center of the signal amplitude of the input signal ISA.

However, when the DC level of the input signal ISA begins to fall, the bottom detection level DL of the bottom detection circuit 3 satisfies the relation ISA<DL and therefore falls by quickly following the fall of the DC level, while on the other hand, the peak detection level DH of the peak detection circuit 2 remains at the initial peak detection level DH. As a result, the fall of the intermediate threshold level TH {=(DH+DL)/2} is sluggish, as shown, gradually deviating from the center of the signal amplitude of the input signal ISA. This causes the pulse width of the output signal OS to decrease, and in the worst case, it becomes impossible to discriminate the state of the input signal ISA=1.

Figure 4:
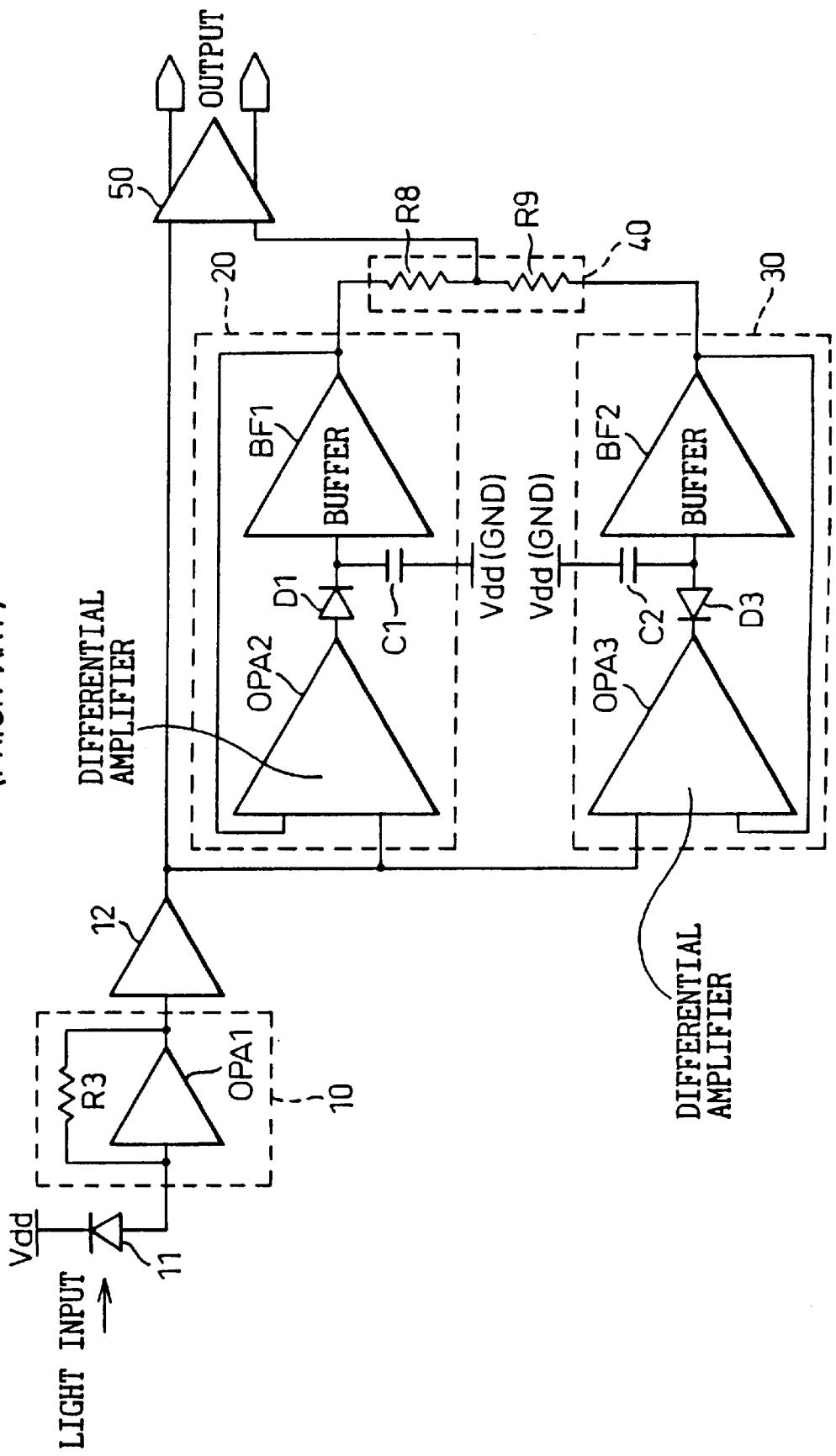
FIG. 4 is a circuit diagram showing a configurational example of an optical receiver circuit as another example of the prior art signal amplifying circuit.

FIG. 4 is a circuit diagram showing a configurational example of an optical receiver circuit as another example of the prior art signal amplifying circuit. In FIG. 4, reference numeral 10 is a preamplifier, 11 is a photodetector, 12 is a buffer circuit, 20 is a peak detection circuit, 30 is a bottom detection circuit, 40 is a resistor voltage divider circuit, and 50 is a reproduction circuit. Here, the peak detection circuit 20, the bottom detection circuit 30, and the resistor voltage divider circuit 40 together constitute the ATC circuit.

In the peak detection circuit 20, the reference terminal side (the terminal opposite from the terminal connected to the input of a buffer BF1) of the capacitor C1 for detecting and holding the maximum level may be connected to ground (GND), as shown in FIG. 1, or instead, may be coupled to some other reference voltage (for example, a high-level supply voltage Vdd), as shown in FIG. 4. Likewise, the bottom detection circuit 30 may be configured so that the reference terminal side (the terminal opposite from the terminal connected to the input of a buffer BF2) of the capacitor C2 for detecting and holding the minimum level is coupled, for example, to the high-level supply voltage Vdd.

The bottom detection circuit 30 detects the absolute minimum level (i.e., the logic 0 level) of the output of the buffer circuit 12, while the peak detection circuit 20 detects the absolute maximum level (i.e., the logic 1 level) of the output of the buffer circuit 12. Here, the threshold level is set at the center between the 0 and 1 levels by the resistor voltage divider circuit 40. Further, by using the ATC circuit (20, 30, 40), the threshold level will be set appropriately in response to the signal DC level and the signal amplitude.

Next, the low-frequency response of the photodetector 11 will be described in detail.

Figure 6A:
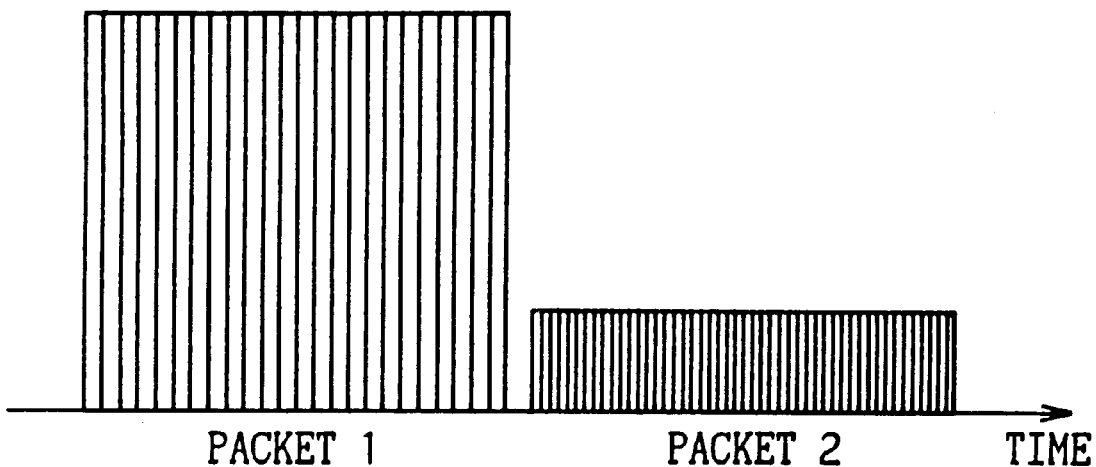
FIGS. 6A and 6B are diagrams showing one example of a waveform response characteristic when the photodetector used in the optical receiver circuit has a low-frequency response.
Figure 6B:
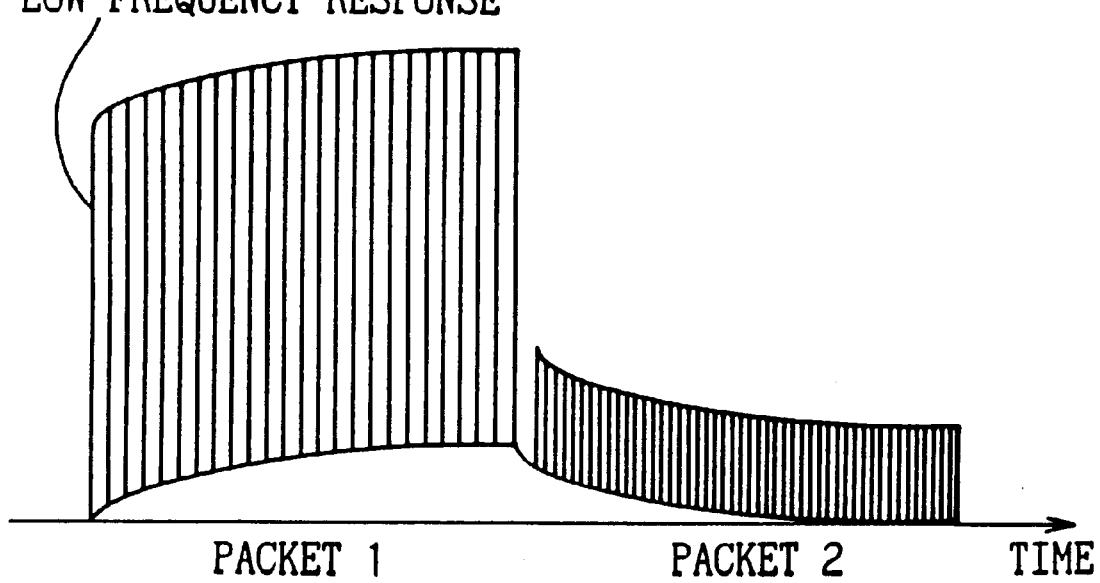

FIG. 5 is a diagram showing one example of the frequency response characteristic of the photodetector used in the optical receiver circuit, and FIGS. 6A and 6B are diagrams showing one example of its waveform response characteristic when the photodetector used in the optical receiver circuit has a low-frequency response.

The frequency response characteristic of the photodetector 11 has a step, for example, at several to several hundred KHz as shown in FIG. 5. One of the causes of this phenomenon is thought to be the carriers generated by light incident on portions other than the light-sensitive areas of the photodetector, where an electric field is not applied. That is, these carriers, which are not accelerated by an electric field, move slowly by diffusion, resulting in a very large time constant.

When packet 1 and packet 2 having different amplitudes, such as shown in FIG. 6A, are input successively to the photodetector having the above-described characteristic, the waveform response (output waveform of the photodetector) will be as shown in FIG. 6B. Here, FIG. 6A shows the waveform of the optical input to the photodetector 11, and FIG. 6B shows the waveform of the output electric current from the photodetector 11.

Here, if the preamplifier 10 is linear, the preamplifier 10 outputs a waveform similar to the waveform shown in FIG. 6B. Because of the low-frequency response, the 0 level gradually rises in the packet 1 having the larger amplitude, while in the smaller-amplitude packet 2 the 0 level falls back to the original value.

When such a waveform is input to the ATC circuit, since the input level changes after the threshold level has been established, the threshold level gradually deviates from the center of the signal amplitude. This effect is particularly pronounced for the packet 2 which exhibits a relatively large change in the 0 level for its signal amplitude.

Figures 7A, 7B:
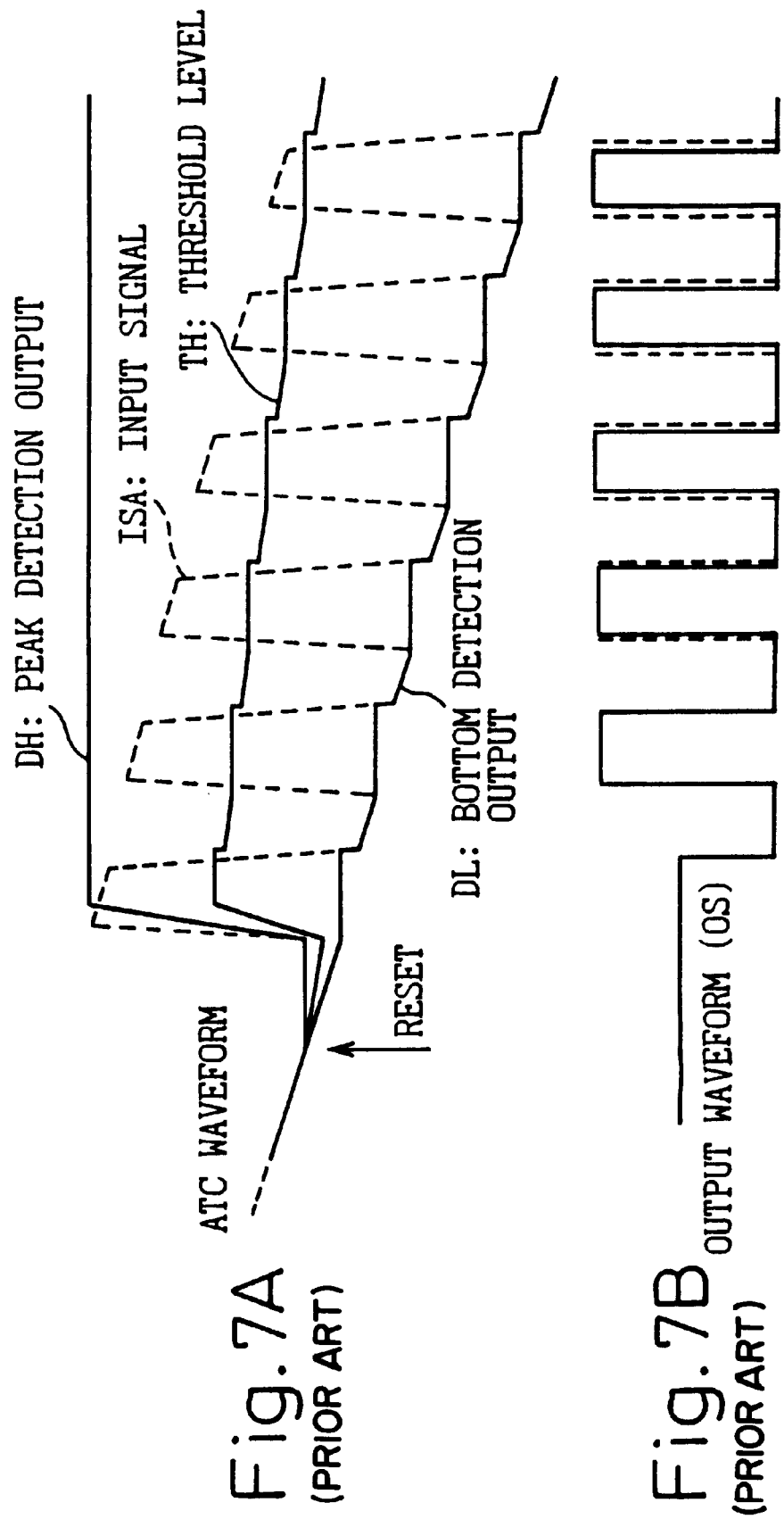
FIGS. 7A and 7B are diagrams for explaining the problem involved in the prior art optical receiver circuit shown in FIG. 4.

FIGS. 7A and 7B are diagrams for explaining the problem involved with the prior art optical receiver circuit shown in FIG. 4, and correspond to the previously shown diagrams of FIG. 3.

When the 0 level falls as for the packet 2 shown in FIG. 6B, the bottom detection output DL (the output of the bottom detection circuit 30) follows the variation of the 0 level, but the peak detection output DH (the output of the peak detection circuit 20) retains the maximum level of the first level of the packet 2, as shown in FIG. 7A, as a result of which the threshold level TH is displaced upward (toward the high-level voltage side). As a result, the pulse width of the output waveform OS is reduced, as shown in FIG. 7B, and in the worst case, it becomes impossible to discriminate the state of the input signal ISA=1. When the 0 level rises like the packet 1 shown in FIG. 6B, it is apparent that the threshold level will be displaced downward.

Figure 8:
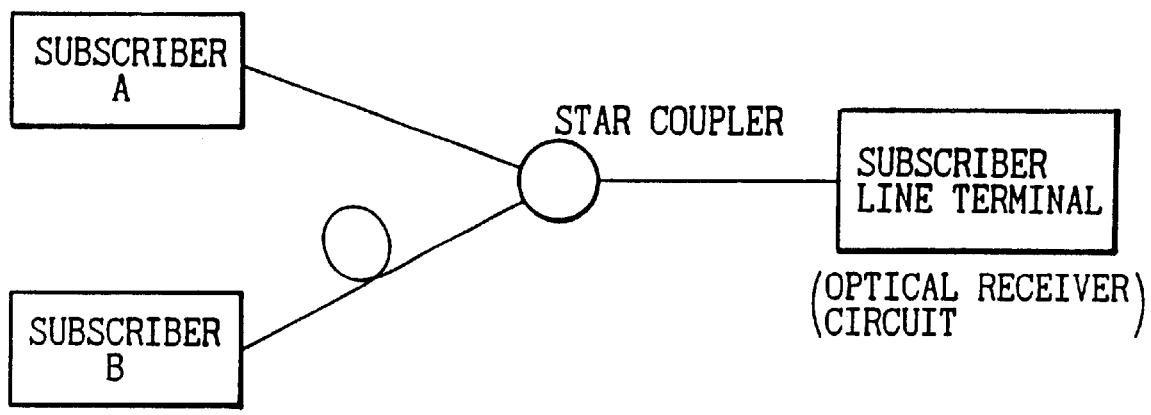
FIG. 8 is a diagram conceptually showing the configuration of a subscriber system where the optical receiver circuit is applied.

FIG. 8 is a diagram conceptually showing the configuration of a subscriber system where the optical receiver circuit is applied.

As shown in FIG. 8, the optical signals from a plurality of subscribers such as shown in FIG. 4 is incorporated, for example, in a star coupler, and the optical receiver circuit receives the signals (packets), from a plurality of subscribers, through the photodetector 11. Here, if the distance to the star coupler is substantially different between subscriber A and subscriber B, the signals (packets 1 and 2 in FIGS. 6A and 6B) input to the photodetector 11 are also different in strength. That is, after the photodetector 11 (in the subscriber line terminal) receives the signal (packet 1 in FIGS. 6A and 6B) from the subscriber A nearer to the subscriber line terminal and therefore providing a large signal level, if it receives the signal (packet 2 in FIGS. 6A and 6B) from the subscriber B farther from the subscriber line terminal and therefore providing a small signal level, the problem explained with reference to FIGS. 6A, 6B, 7A, and 7B will occur.

The principle of the signal amplifying circuit according to the present invention and the preferred embodiments of the automatic threshold control circuit and signal amplifying circuit according to the present invention will now be described below with reference to the accompanying drawings.

Figure 9A:
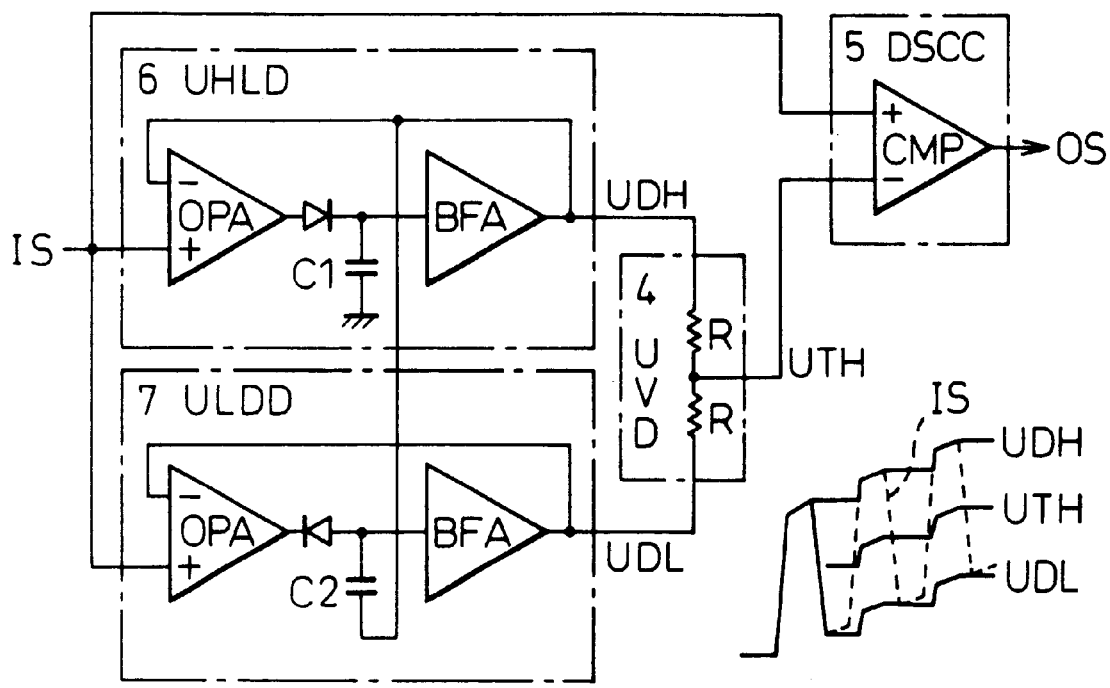
FIGS. 9A and 9B are diagrams for explaining the principle of the signal amplifying circuit according to the present invention.

As shown in FIG. 9A, according to the present invention, there is provided an automatic threshold control circuit comprising: an absolute peak detection circuit 6 for detecting an absolute maximum level of an input signal; a relative bottom detection circuit 7 for detecting, in accordance with the input signal, a minimum level relative to the maximum level detected by the absolute peak detection circuit 6; and a voltage divider circuit 4 for generating a threshold level by dividing the absolute maximum level and the relative minimum level in a predetermined ratio. More specifically, the relative bottom detection circuit 7 is configured so that the reference terminal of a capacitor C2 for holding the relative minimum level is connected to an output terminal of the absolute peak detection circuit 6. Further, a signal amplifying circuit can be constructed by providing a reproduction circuit which discriminates the input signal by using the threshold level from the automatic threshold control circuit. The absolute peak detection circuit 6 is configured so that the reference terminal of a capacitor C1 for holding the absolute maximum level is connected to a line of a prescribed reference level, for example, a ground line or a power supply line.

Here, instead of configuring the voltage divider circuit 4 to generate a threshold voltage by dividing the absolute maximum level and the relative minimum level in a predetermined ratio, the voltage divider circuit 4 may be configured to generate a divided voltage signal by dividing the absolute maximum level, detected by the absolute peak detection circuit 6, and the input signal in a predetermined ratio, while also configuring the relative bottom detection circuit 7 to generate, in accordance with the divided voltage signal, a threshold level from the minimum level relative to the absolute maximum level detected by the absolute peak detection circuit 6.

Figure 9B:
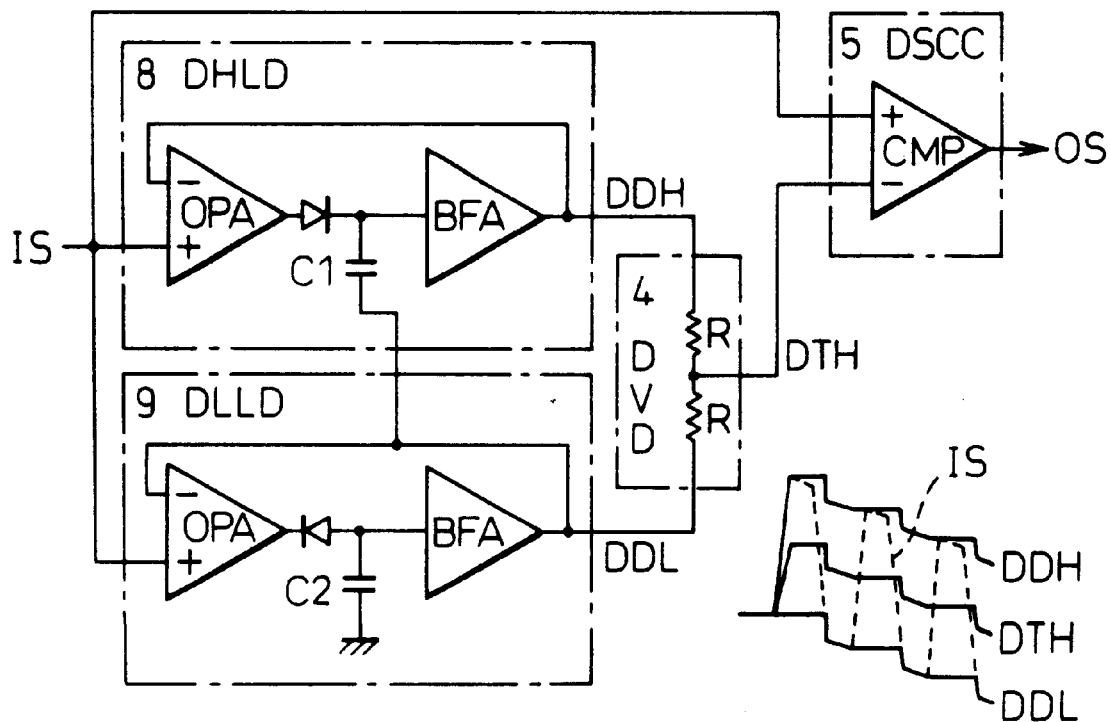

As shown in FIG. 9B, according to the present invention, there is provided an automatic threshold control circuit comprising: an absolute bottom detection circuit 9 for detecting an absolute minimum level of an input signal; a relative peak detection circuit 8 for detecting, in accordance with the input signal, a maximum level relative to the minimum level detected by the absolute bottom detection circuit 9; and a voltage divider circuit 4 for generating a threshold level by dividing the absolute minimum level and the relative maximum level in a predetermined ratio. More specifically, the relative peak detection circuit 8 is configured so that the reference terminal of a capacitor C1 for holding the relative maximum level is connected to an output terminal of the relative bottom detection circuit 9. Further, a signal amplifying circuit can be constructed by providing a reproduction circuit which discriminates the input signal by using the threshold level from the automatic threshold control circuit. The absolute bottom detection circuit 9 is configured so that the reference terminal of a capacitor C2 for holding the absolute minimum level is connected to a line of a prescribed reference level, for example, a ground line or a power supply line.

Here, instead of configuring the voltage divider circuit 4 to generate a threshold voltage by dividing the absolute minimum level and the relative maximum level in a predetermined ratio, the voltage divider circuit 4 may be configured to generate a divided voltage signal by dividing the absolute minimum level, detected by the absolute bottom detection circuit 9, and the input signal in a predetermined ratio, while also configuring the relative peak detection circuit 8 to generate, in accordance with the divided voltage signal, a threshold level from the maximum level relative to the absolute minimum level detected by the absolute bottom detection circuit 9.

Further, according to the present invention, there is provided a signal amplifying circuit comprising: a level-rise following automatic threshold control circuit which follows a rise in an input signal; a level-fall following automatic threshold control circuit which follows a fall in the input signal; a discrimination circuit which performs discrimination between a rise and a fall in DC level of the input signal, based on detection levels from the level-rise following automatic threshold control circuit and level-fall following automatic threshold control circuit; a selection circuit which selects a threshold level generated by the level-rise following automatic threshold control circuit or the level-fall following automatic threshold control circuit, in accordance with an output of the discrimination circuit; and a reproduction circuit which discriminates the input signal by using the threshold level.

Figure 10:
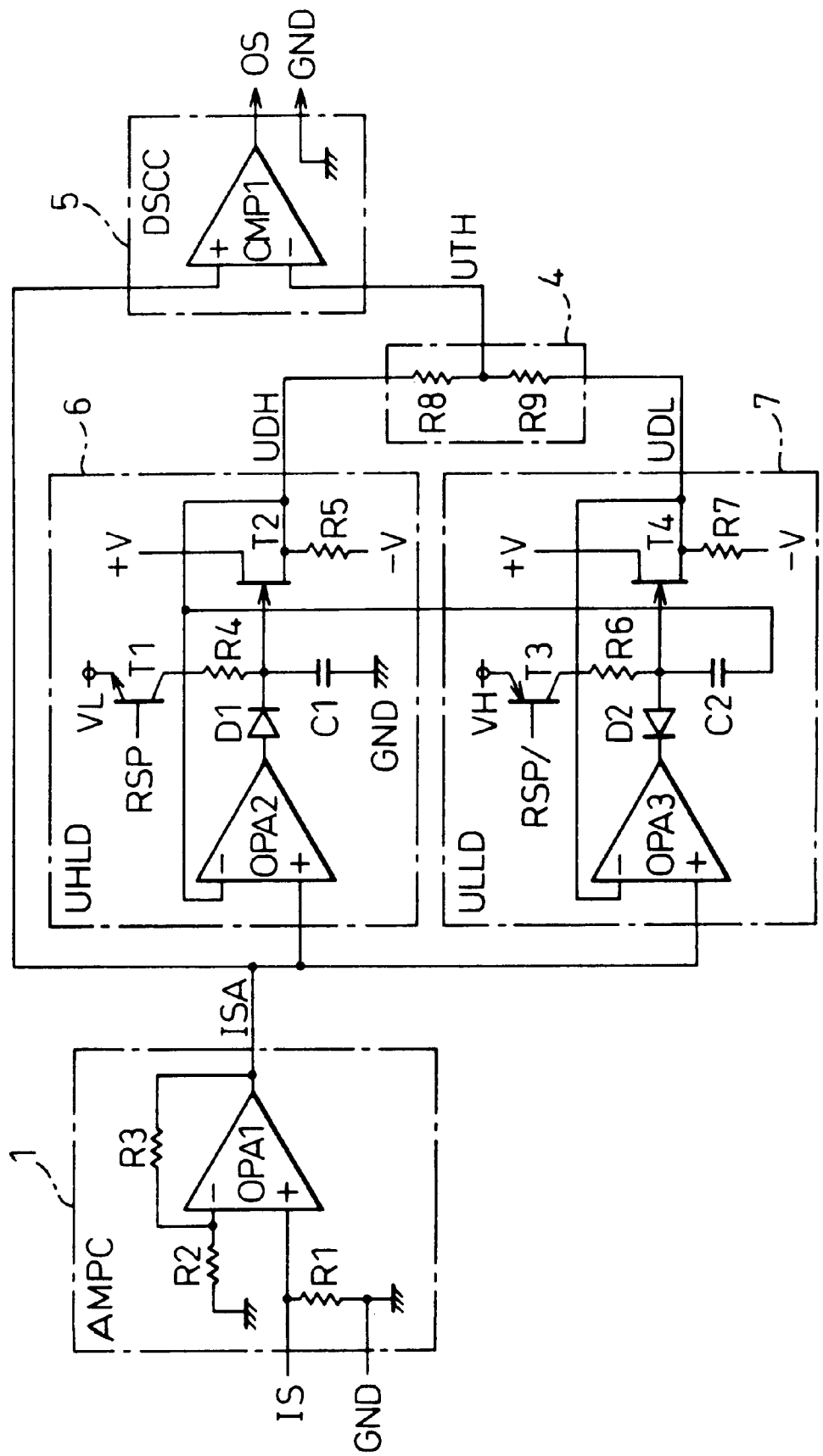
FIG. 10 is a block circuit diagram showing a first embodiment of the signal amplifying circuit according to the present invention.

FIG. 10 is a block circuit diagram showing a first embodiment of the signal amplifying circuit according to the present invention. The signal amplifying circuit shown in FIG. 10 has a circuit configuration of the type that follows a rise in the DC level of an input signal as well as the amplitude variation thereof.

In FIG. 10, reference numeral 1 is a DC direct-coupled, wide-band amplifier (AMPC), 6 is a peak detection circuit (UHLD), 7 is a bottom detection circuit (ULLD), 4 is a resistor voltage divider circuit (UVD), and 5 is a reproduction circuit (DSCC). Here, the amplifying circuit 1, the resistor voltage divider circuit 4, and the reproduction circuit 5 are the same in operation as the corresponding circuits in the prior art. The amplifying circuit 1 here can also be constructed as an ordinary DC amplifier consisting of one or more transistors. The bandwidth is, for example, about 100 MHz.

In the peak detection circuit 6, one end of a peak detection/holding capacitor C1 (for example, several tens to several hundreds of picofarads) is connected to ground (GND); this peak detection circuit 6 is configured to detect and hold an absolute maximum level UDH of an input signal ISA, as in the prior art peak detection circuit (for example, the peak detection circuit 2 in FIG. 1). The reference terminal of the capacitor C1 may be connected to some other reference voltage, for example, a supply voltage (power supply line).

In the bottom detection circuit 7, one end of a bottom detection/holding capacitor C2 (for example, several tens to several hundreds of picofarads) is connected to an output terminal of the peak detection circuit 6. With this arrangement, the bottom detection circuit 7 detects and holds a minimum signal level UDL relative to the maximum level UDH detected by the peak detection circuit 6. That is, the bottom detection level UDL that is detected and held corresponds to the lowest signal amplitude out of relative level differences (equivalent to signal amplitudes) between the maximum level UDH, detected by the peak detection circuit 6, and the input signal ISA.

Figure 11:
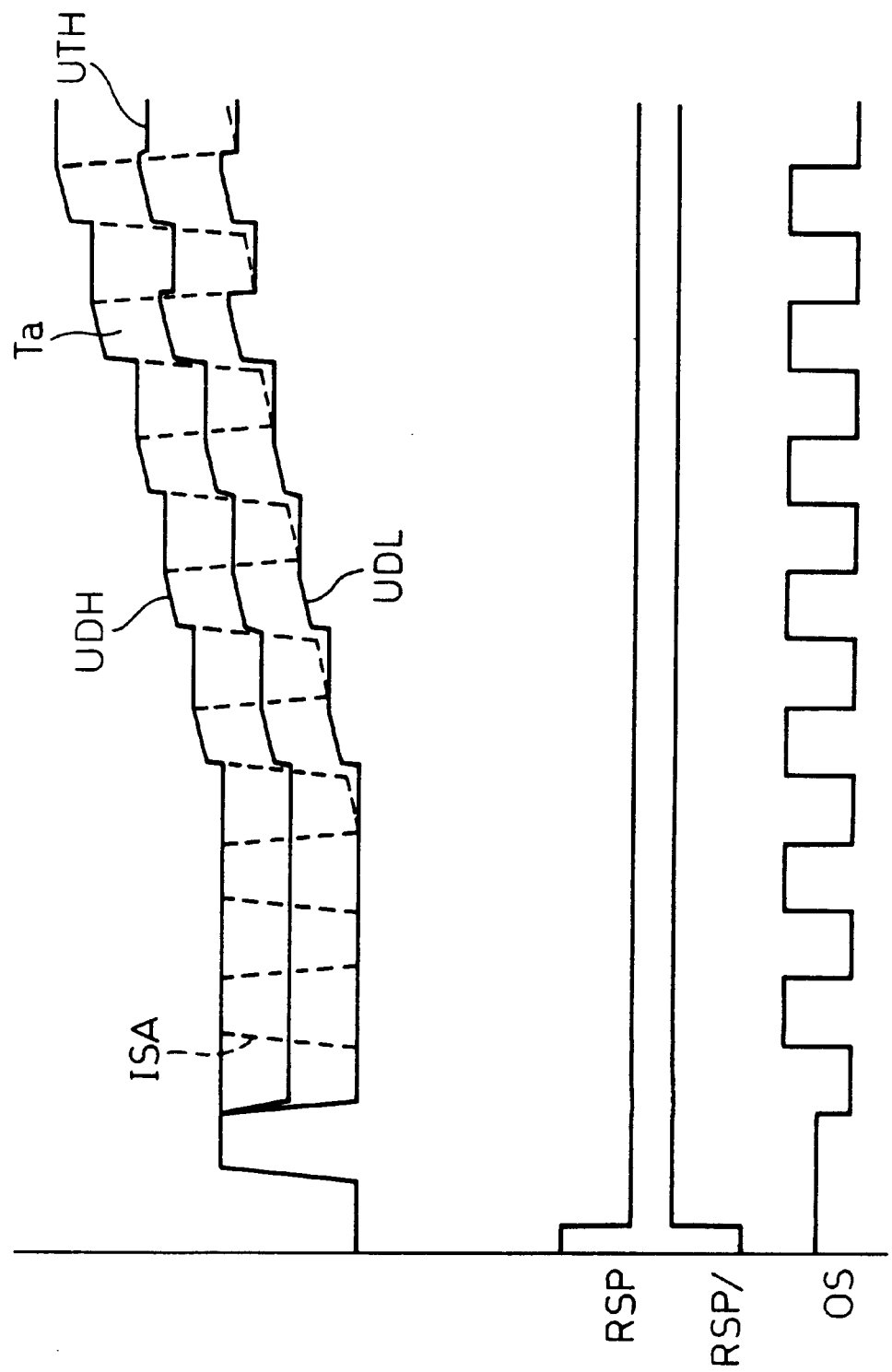
FIG. 11 is a diagram for explaining the operation (waveform response) of the signal amplifying circuit shown in FIG. 10.

FIG. 11 is a diagram for explaining the operation (waveform response) of the signal amplifying circuit shown in FIG. 10. The operation of the signal amplifying circuit of the first embodiment will be described in detail with reference to FIGS. 10 and 11.

In the initialized condition of the bottom detection circuit 7, a transistor T3 is caused to conduct by a negative reset pulse signal RSP/ that occurs, for example, during the interval when the input signal ISA=0 (corresponding to a logic 0 level), and the capacitor C2 is charged toward a prescribed bias high level VH. A MOS or junction field-effect transistor T4 having a high input impedance forms a source follower, and outputs the bottom detection signal UDL at low impedance, whose potential is approximately equal to the charge potential of the capacitor C2.

On the other hand, an operational amplifier OPA2 compares the input signal ISA with the bottom detection signal UDL, and when UDL>ISA, rapidly discharges the capacitor C2 through a diode D2. With the charging by the transistor T3 and the discharging by the operational amplifier OPA2, the bottom detection level UDL at initialization is thus finally brought to a level equal to the signal level of the input signal ISA=0 at the time of the above resetting.

After the above resetting, when the input signal ISA next changes to 1 (corresponding to a logic 1 level), since ISA>UDH, in the peak detection circuit 6 the capacitor C1 is rapidly charged to approximately the same level as the signal level of the input signal ISA=1 at that time. On the other hand, in the bottom detection circuit 7 at that time, the capacitor C2 is not discharged because ISA>UDL, but since the peak detection level UDH of the peak detection circuit 6 has risen to the signal level of the input signal ISA=1, the reference side potential of the capacitor C2 is raised by the same amount. As a result, the bottom detection level UDL of the bottom detection circuit 7 is temporarily raised to the signal level of the input signal ISA=1 at that time.

Next, when the input signal ISA changes to 0, in the peak detection circuit 6 charging of the capacitor C1 does not occur because ISA<UDH. The peak detection level UDH is therefore held at the initial detection level UDH. In the bottom detection circuit 7, on the other hand, since ISA<UDL, the capacitor C2 is rapidly discharged to approximately the same level as the signal level of the input signal ISA=0 at that time. As a result, the bottom detection level UDL is also lowered to the signal level of the input signal ISA=0 at that time.

The resistor voltage divider circuit 4 is constructed, for example, from resistors R8 and R9 with equal resistance values, and outputs a threshold level UTH=(UDH+UDL)/2 which corresponds to a level just at the center between the peak detection level UDH and the bottom detection level UDL. Further, the reproduction circuit 5 comprises a comparator COMP1, which produces an output signal OS=1 (logic 1 level) when ISA>UTH, and an output signal OS=0 (logic 0 level) when ISA≦UTH. For a while after that, since there is no change in the signal amplitude and the DC level of the input signal ISA, the circuit remains in the above state.

Thereafter, when the DC level of the input signal ISA begins to rise, since ISA>UDH, in the peak detection circuit 6 the capacitor C1 is charged to approximately the same level as the signal level of the input signal ISA=1 at that time. As a result, the peak detection level UDH also rises to the signal level of the input signal ISA=1 at that time.

In the bottom detection circuit 7, on the other hand, the capacitor C2 is not discharged because ISA>UDL, but since the peak detection level UDH of the peak detection circuit 6 has risen by an amount equal to the DC drift, the reference side potential of the capacitor C2 is raised by the same amount. As a result, the bottom detection level UDL of the bottom detection circuit 7 is also raised by an amount equal to the DC drift, and accordingly, the threshold level UTH of the resistor voltage divider circuit 4 is raised by an amount equal to the DC drift.

In the reproduction circuit 5, therefore, the DC drift of the input signal ISA is offset by the raised threshold level UTH, so that the reproduction circuit 5 can correctly discriminate the output signal OS=1 or 0 by using the threshold level UTH set at one half the amplitude of the input signal ISA, despite the rise of the DC level of the input signal ISA.

At time Ta in FIG. 11, the signal amplitude of the input signal ISA also begins to increase. When the signal amplitude increases, in the peak detection circuit 6 the capacitor C1 is charged because ISA>UDH, and in the bottom detection circuit 7, the capacitor C2 is discharged during the subsequent period when ISA<UDL. In this way, the increase in the signal amplitude also is followed properly.

Figure 12:
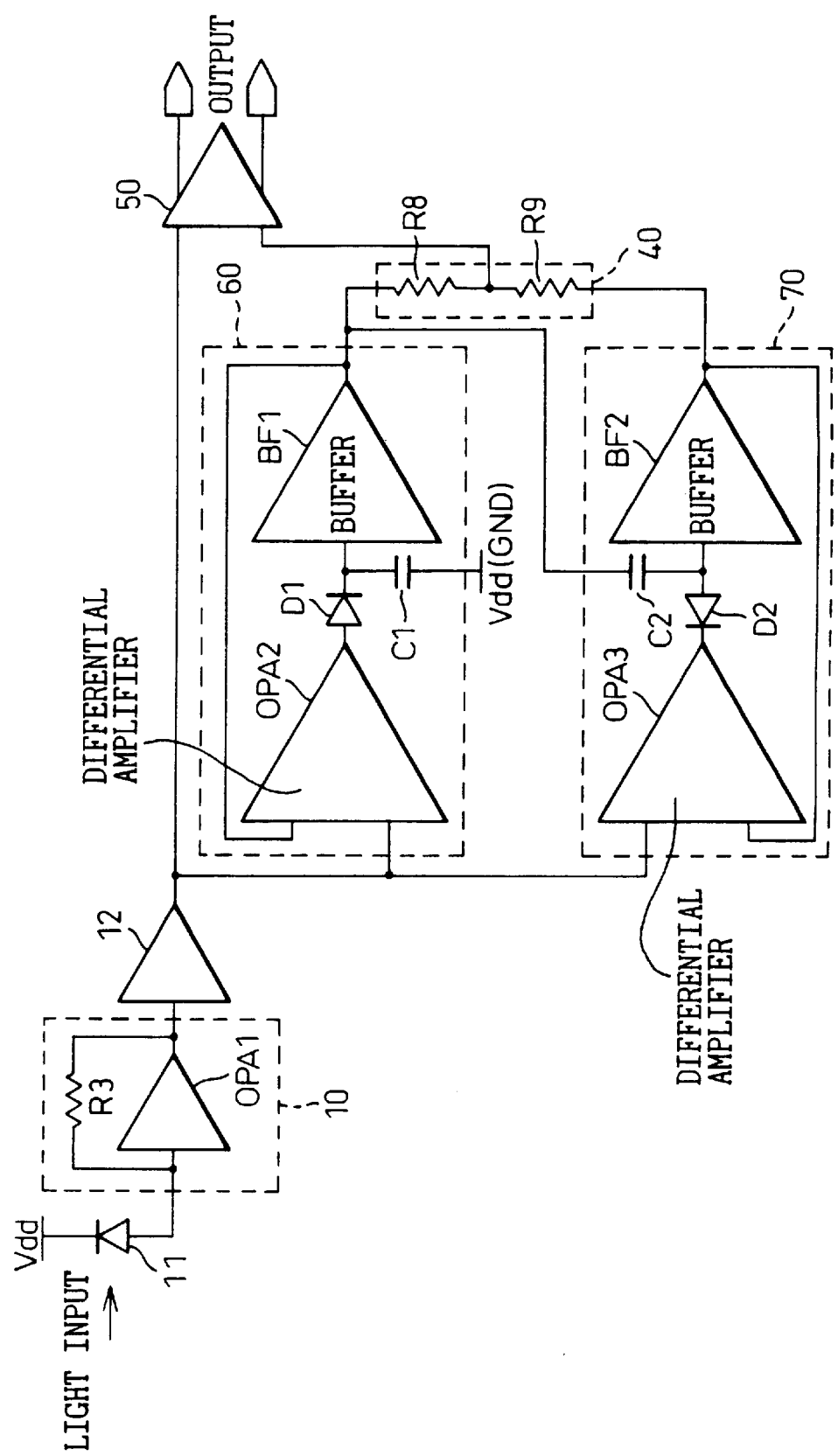
FIG. 12 is a block circuit diagram showing a modified example of the first embodiment of the signal amplifying circuit (optical receiver circuit) shown in FIG. 10.

FIG. 12 is block circuit diagram showing a modified example of the first embodiment of the signal amplifying circuit (optical receiver circuit) shown in FIG. 10. In FIG. 12, reference numeral 10 is a preamplifier, 11 is a photodetector, 12 is a buffer circuit, 40 is a resistor voltage divider circuit, 50 is a reproduction circuit, 60 is a peak detection circuit, and 70 is a bottom detection circuit. Here, the peak detection circuit 60, the bottom detection circuit 70, and the resistor voltage divider circuit 40 together constitute the ATC circuit.

In the peak detection circuit 60, the reference terminal side of the peak detection/holding capacitor C1 may be connected to ground (GND), as shown in FIG. 10, or instead, may be coupled to some other reference voltage (for example, a high-level supply voltage Vdd), as shown in FIG. 12. In the bottom detection circuit 70, the reference terminal side of the bottom detection/holding capacitor C2 is connected to the output terminal of the peak detection circuit 60.

With this configuration, the peak detection circuit 60 detects the absolute maximum level (i.e., the logic 1 level) of the output of the buffer circuit 12, and the bottom detection circuit 70 detects the minimum value (i.e., the logic 0 level) of the relative level difference between the output of the buffer circuit 12 and the output of the peak detection circuit 60. Then, the threshold level is set at the center between the 0 and 1 levels by the resistor voltage divider circuit 40.

As described above, in the first embodiment (modified example) of the signal amplifying circuit of the present invention shown in FIG. 10 (FIG. 12), the capacitor reference terminal of the bottom detection circuit 7 (70) is connected to the output of the peak detection circuit 6 (60), not to the high-level supply voltage Vdd (ground GND) as in the prior art optical receiver circuit (signal amplifying circuit) shown in FIG. 4. Therefore, the bottom detection circuit 7 (70) detects the minimum value of the relative level difference between the output of the amplifying circuit 1 (buffer circuit 12) and the output of the peak detection circuit 6 (60). In this case, even when the output of the peak detection circuit 6 (60) fluctuates because of the fluctuation of the 1 level, since the diode D2 remains off (unless the change is so great that the 0 level exceeds the 1 level of the previous bit) and the input impedance of the transistor T4 (buffer BF2) is sufficiently high, the charge on the capacitor C2 is retained. As a result, the potential difference between the output of the peak detection circuit 6 (60) and the output of the bottom detection circuit 7 (70) is retained, the output of the bottom detection circuit 7 (70) thus being interlocked to the output of the peak detection circuit 6 (60).

Figures 13A, 13B:
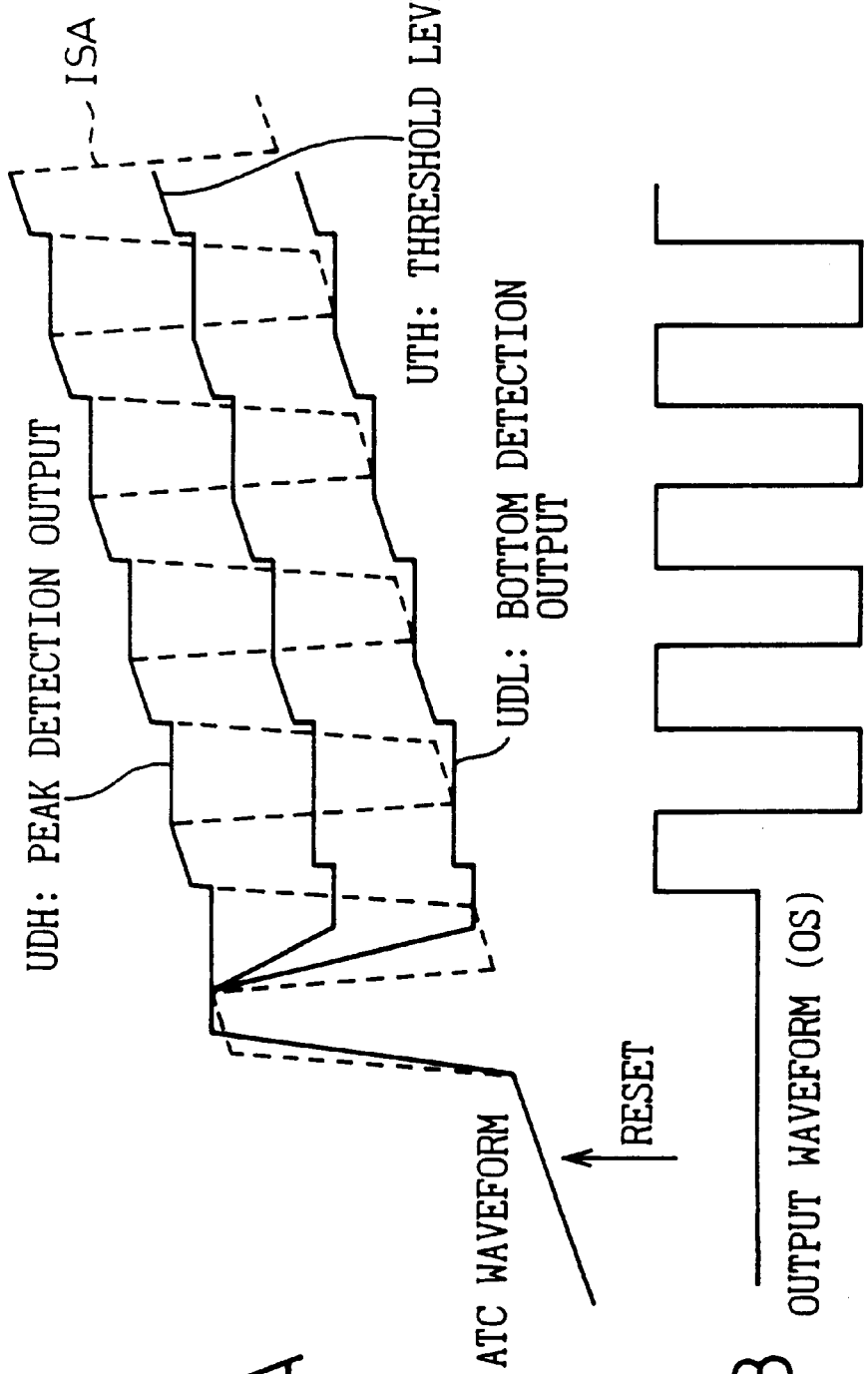
FIGS. 13A and 13B are diagrams for explaining the operation of the signal amplifying circuit shown in FIG. 12.

FIGS. 13A and 13B are diagrams for explaining the operation of the signal amplifying circuit shown in FIG. 12, and correspond to the previously shown diagrams of FIG. 11. Further, FIG. 14 is a diagram showing an operational simulation of the signal amplifying circuit shown in FIG. 12; as can be seen, fundamentally the same waveform as that shown in FIG. 13A can be obtained.

Figure 14:
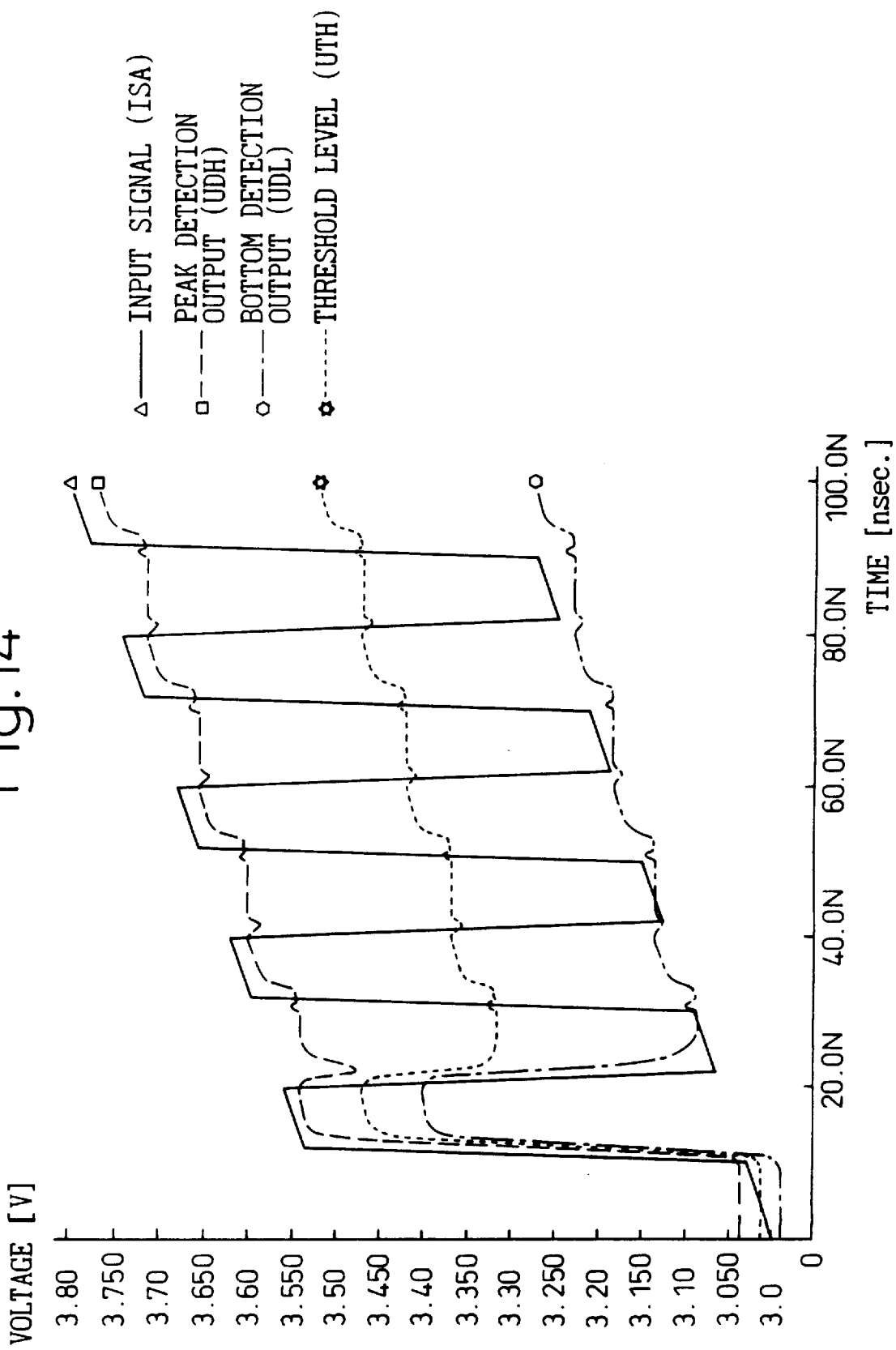
FIG. 14 is a diagram showing an operational simulation of the signal amplifying circuit shown in FIG. 12.

In the modified example also, the capacitor reference terminal of the bottom detection circuit 70 is connected to the output of the peak detection circuit 60, as shown in FIG. 12, so that the bottom detection circuit 70 operates to detect the minimum value of the relative level being output from the peak detection circuit 60; in this way, the threshold level can be set at the center of the signal amplitude regardless of the fluctuation of the 0 level, as shown in FIGS. 13A and 14. It will also be appreciated that the present invention can be used not only as the optical receiver circuit shown in FIG. 12 but also as a signal amplifying circuit, such as shown in FIG. 10, for amplifying an arbitrary pulse signal.

Figure 15:
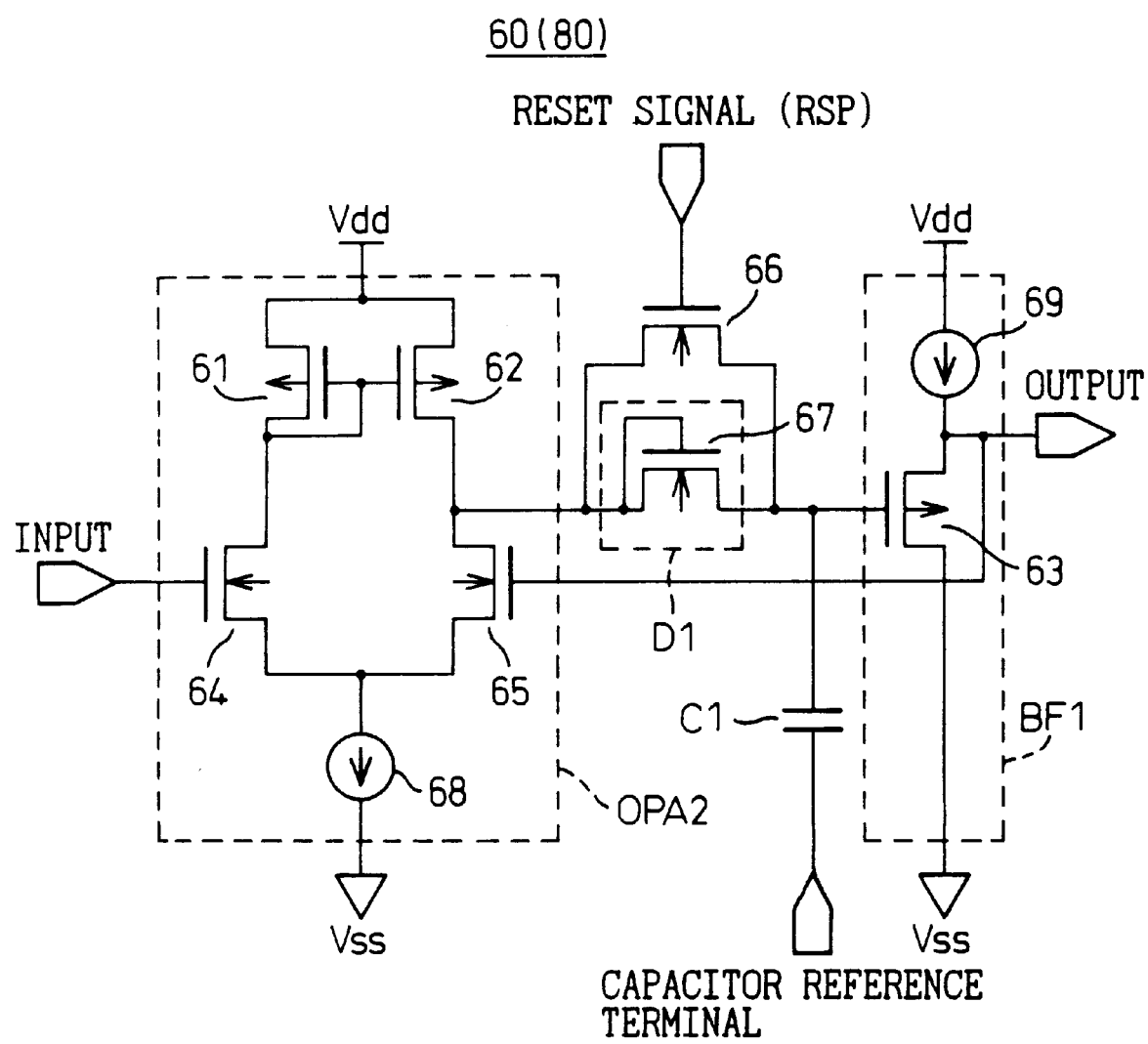
FIG. 15 is a circuit diagram showing one example of a peak detection circuit used in the signal amplifying circuit of the present invention.
Figure 16:
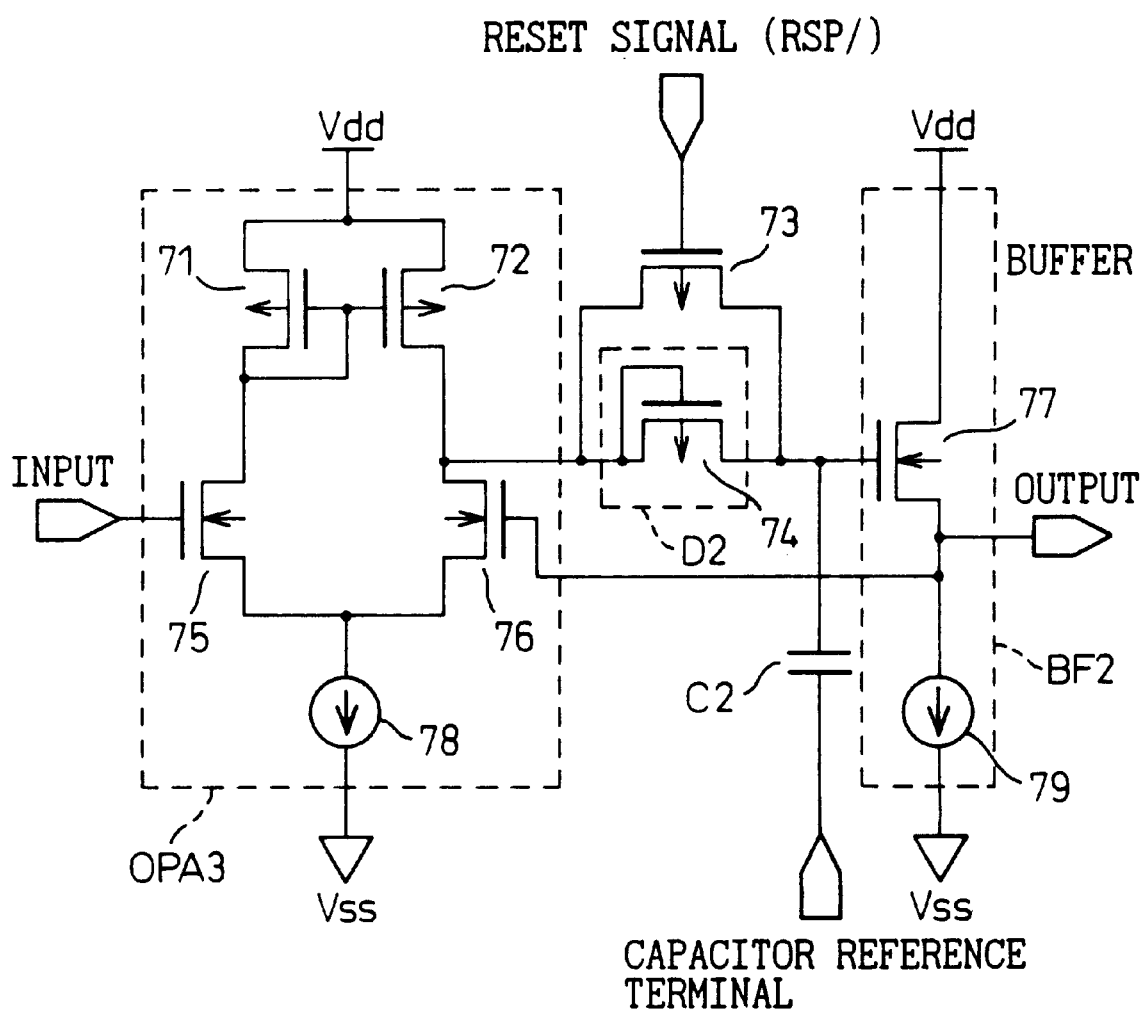
FIG. 16 is a circuit diagram showing one example of a bottom detection circuit used in the signal amplifying circuit of the present invention.

FIG. 15 is a circuit diagram showing one example of the peak detection circuit used in the signal amplifying circuit of the present invention, and FIG. 16 is a circuit diagram showing one example of the bottom detection circuit used in the signal amplifying circuit of the present invention.

A circuit such as shown in FIG. 15, for example, can be used as the peak detection circuit (60, 80) in the signal amplifying circuit of the present invention, and a circuit such as shown in FIG. 16, for example, can be used as the bottom detection circuit (70, 90).

As shown in FIG. 15, the peak detection circuit 60 (80) comprises, for example, P-channel MOS transistors 61 to 63, N-channel MOS transistors 64 to 67, current sources 68 and 69, and a capacitor C1. The transistors 61, 62, 64, and 65 and the current source 68 together constitute the differential amplifier (op amp) OPA2, while the transistor 63 and the current source 69 constitute the buffer (source follower) BF1. Here, the transistor 67 constitutes the diode D1, and the transistor 66 is connected in parallel with the diode D1 (67). The configuration is such that a reset operation is performed by short-circuiting both ends of the diode D1 by the transistor 66 during the period when the reset signal (RSP) applied to its gate is at a high (1) level.

As shown in FIG. 16, the bottom detection circuit 70 (90) comprises, for example, P-channel MOS transistors (MOSFETs) 71 to 74, N-channel MOS transistors 75 to 77, current sources 78 and 79, and a capacitor C2. The transistors 71, 72, 75, and 76 and the current source 78 together constitute the differential amplifier (op amp) OPA3, while the transistor 77 and the current source 79 constitute the buffer BF2. Here, the transistor 74 constitutes the diode (source follower) D2, and the transistor 73 is connected in parallel with the diode D2 (74). The configuration is such that a reset operation is performed by short-circuiting both ends of the diode D2 by the transistor 73 during the period when the reset signal (RSP/) applied to its gate is at a low (0) level.

In the above peak detection circuit 60 (80) and bottom detection circuit 70 (90), MOS transistors are used for the construction of the differential amplifiers OPA2 and OPA3, but it will be recognized that the same effects can be achieved when bipolar transistors, etc. are used. Further, the diodes D1 and D2 are constructed from the MOS transistors 67 and 74, respectively, each with gate and drain connected, but instead, ordinary pn junction diodes may be used.

Figure 17:
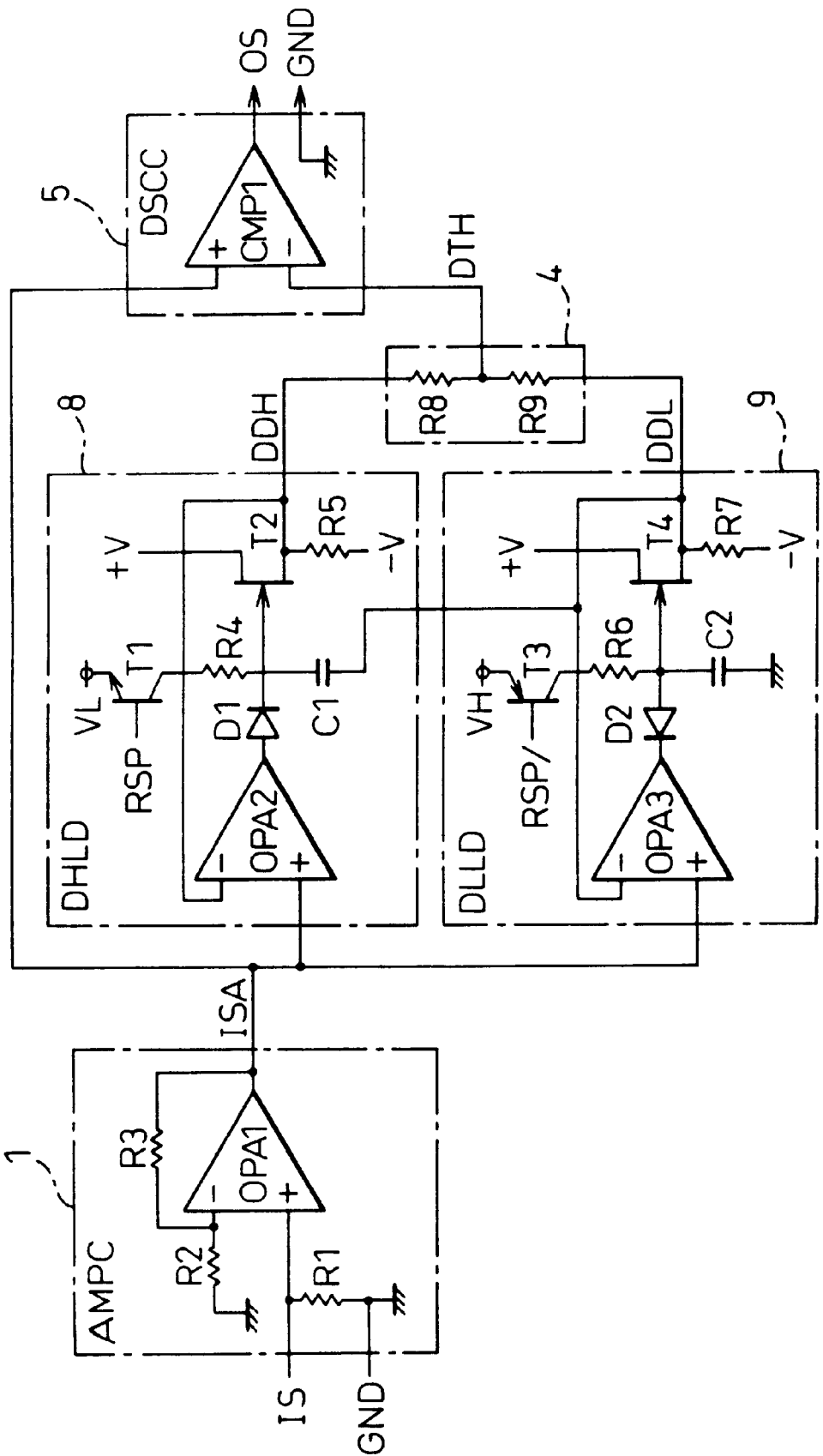
FIG. 17 is a block circuit diagram showing a second embodiment of the signal amplifying circuit according to the present invention.

FIG. 17 is a block circuit diagram showing a second embodiment of the signal amplifying circuit according to the present invention. This signal amplifying circuit has a circuit configuration of the type that follows a fall in the DC level of an input signal as well as the amplitude variation thereof.

In FIG. 17, reference numeral 8 designates a peak detection circuit (DHLD), and 9 indicates a bottom detection circuit (DLLD).

In the bottom detection circuit 9, the reference terminal side of the capacitor C2 (the capacitor reference terminal: the terminal opposite from the terminal connected to the input of the buffer BF2) is connected to ground (GND). Accordingly, the bottom detection circuit 9 detects and holds an absolute minimum level DDL of the input signal ISA, as in the prior art bottom detection circuit 3.

In the peak detection circuit 8, the reference side terminal of the capacitor C1 (the terminal opposite from the terminal connected to the input of the buffer BF1) is connected to an output terminal of the bottom detection circuit 9. Accordingly, the peak detection circuit 8 detects and holds a maximum signal level DDH relative to the minimum level DDL detected by the bottom detection circuit 9. That is, the peak detection level DDH is detected and held that corresponds to the highest signal amplitude out of relative level differences (equivalent to signal amplitudes) between the minimum level DDL, detected by the bottom detection circuit 9, and the input signal ISA.

Figure 18:
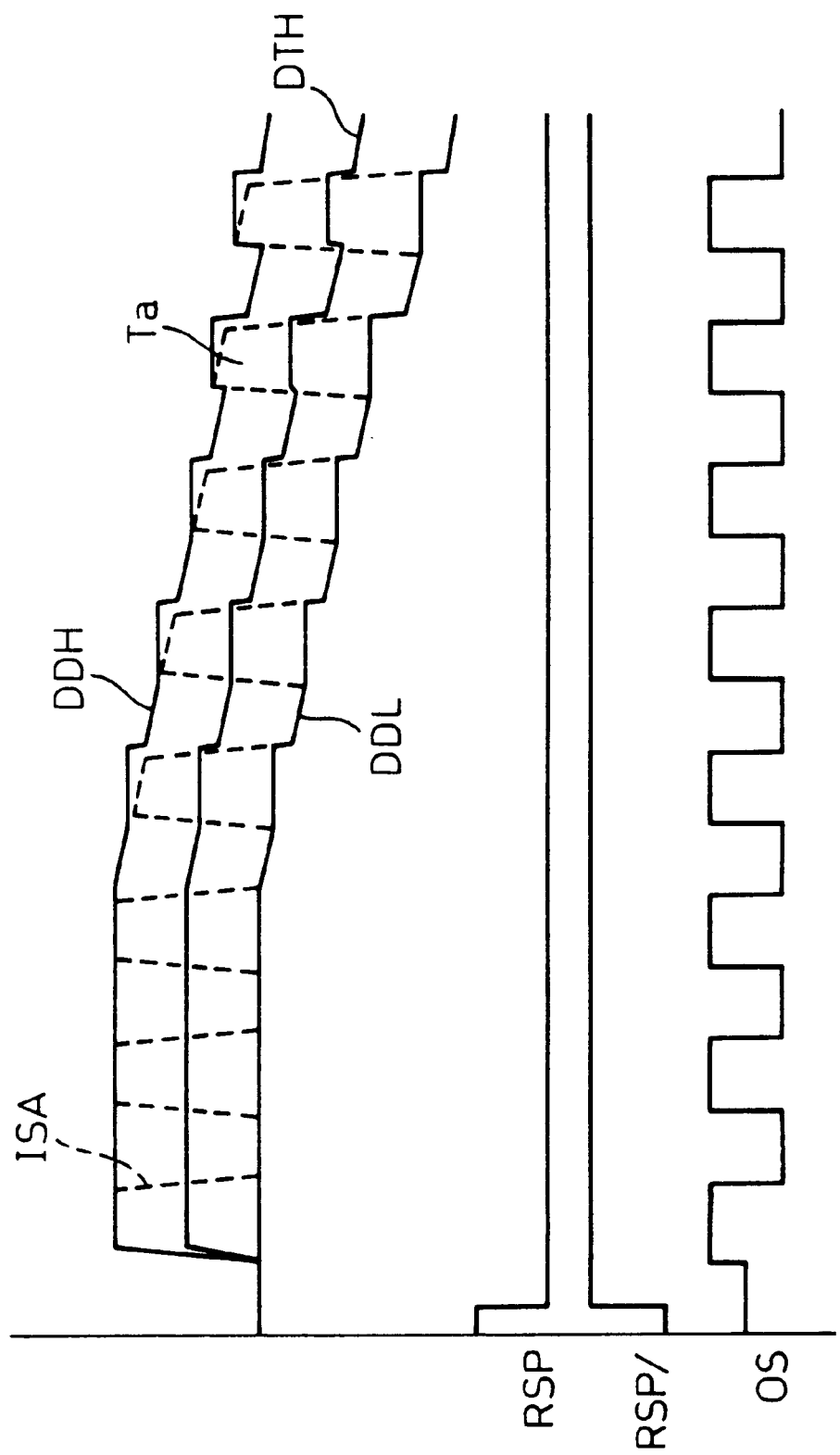
FIG. 18 is a diagram for explaining the operation (waveform response) of the signal amplifying circuit shown in FIG. 17.

FIG. 18 is a diagram for explaining the operation (waveform response) of the signal amplifying circuit shown in FIG. 17.

In the initialized condition of the signal amplifying circuit shown in FIG. 17, the peak detection level DDH and the bottom detection level DDL are both reset to the signal level of the input signal ISA=0 by reset pulse signals RSP and RSP/ that occur, for example, during the period when the input signal ISA=0.

After the above resetting, when the input signal ISA next changes to 1, since ISA>DDH, in the peak detection circuit 8 the capacitor C1 is rapidly charged to approximately the same level as the signal level of the input signal ISA=1 at that time. On the other hand, in the bottom detection circuit 9, the capacitor C2 is not discharged because ISA>DDL. The bottom detection level DDL is therefore held at the initial bottom detection level DDL.

The resistor voltage divider circuit 4 outputs a threshold level DTH=(DDH+DDL)/2, for example. The reproduction circuit 5 produces an output signal OS=1 when ISA>DTH, and an output signal OS=0 when ISA≦DTH. For a while after that, the above state is maintained, and when the DC level of the input signal ISA begins to fall, in the bottom detection circuit 9 the capacitor C2 is discharged, because ISA<DDL, to approximately the same level as the signal level of the input signal ISA=0 at that time. As a result, the bottom detection level DDL also falls to the signal level of the input signal ISA=0 at that time.

In the peak detection circuit 8, on the other hand, the capacitor C1 is not charged because ISA<DDH, but since the bottom detection level DDL of the bottom detection circuit 9 has fallen by an amount equal to the DC drift, the reference side potential of the capacitor C1 is lowered by the same amount. As a result, the peak detection level DDH is also lowered by an amount equal to the DC drift, and accordingly, the threshold level DTH of the resistor voltage divider circuit 4 is lowered by an amount equal to the DC drift.

In the reproduction circuit 5, therefore, the DC drift is offset, so that the reproduction circuit 5 can correctly discriminate the threshold signal OS=1 or 0 by using the threshold level DTH set at one half the amplitude of the input signal ISA, despite the fall of the DC level.

At time Ta in FIG. 18, the signal amplitude of the input signal ISA also begins to increase, but with the charging of the capacitor C1 and the subsequent discharging of the capacitor C2, the increase in the signal amplitude is also followed properly.

Figure 19:
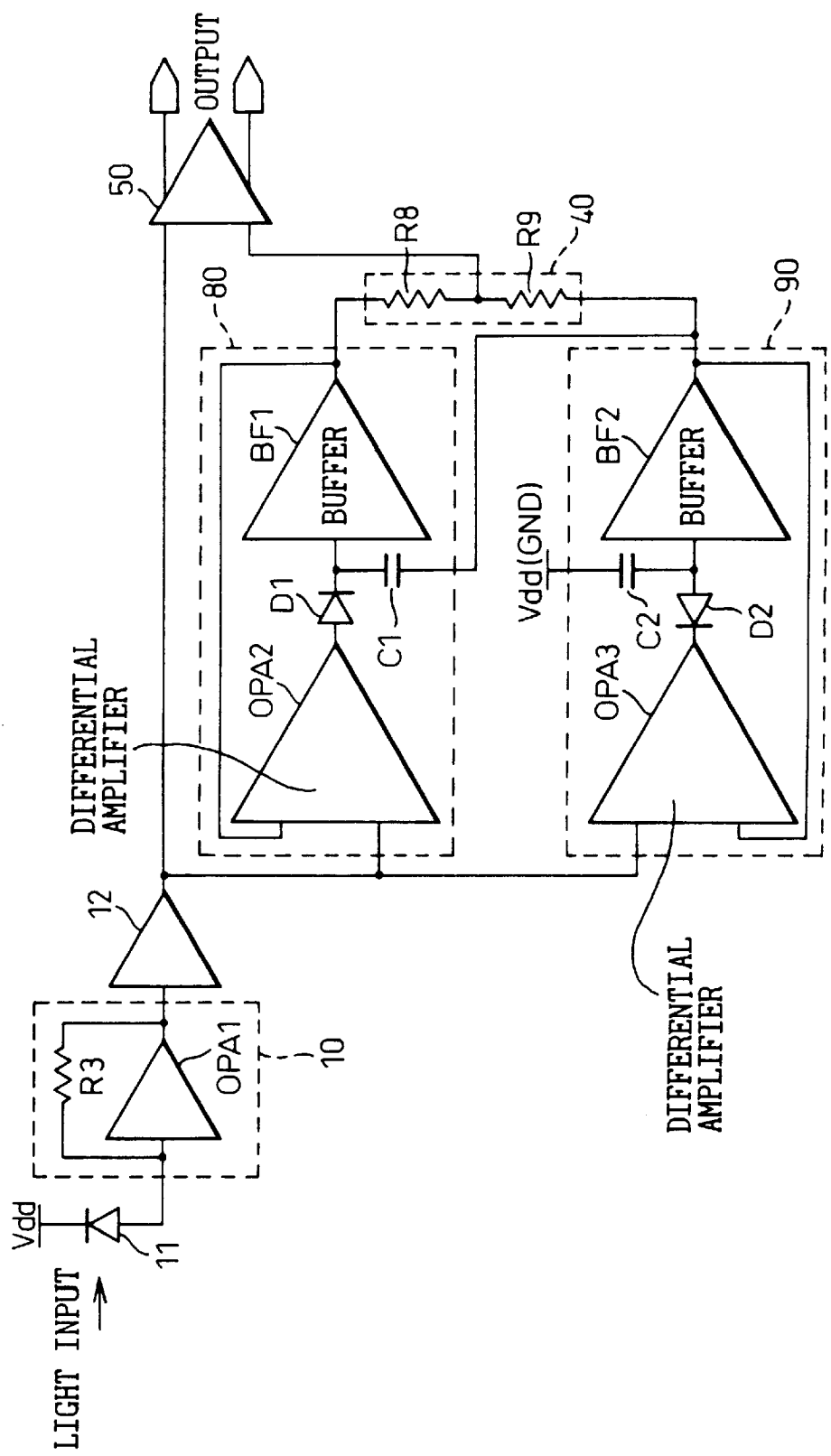
FIG. 19 is a block circuit diagram showing a modified example of the second embodiment of the signal amplifying circuit (optical receiver circuit) shown in FIG. 17.

FIG. 19 is a block circuit diagram showing a modified example of the second embodiment of the signal amplifying circuit (optical receiver circuit) shown in FIG. 17. In FIG. 19, reference numeral 10 is a preamplifier, 11 is a photodetector, 12 is a buffer circuit, 40 is a resistor voltage divider circuit, 50 is a reproduction circuit, 80 is a peak detection circuit, and 90 is a bottom detection circuit. Here, the peak detection circuit 80, the bottom detection circuit 90, and the resistor voltage divider circuit 40 together constitute the ATC circuit.

In the bottom detection circuit 90, the reference terminal side of the capacitor C2 for detecting and holding the minimum level may be connected to ground (GND), as shown in FIG. 17, or instead, may be coupled to some other reference voltage (for example, a high-level supply voltage Vdd), as shown in FIG. 19. In the peak detection circuit 80, the reference terminal side of the peak detection/holding capacitor C1 is connected to the output terminal of the bottom detection circuit 90.

With this configuration, the bottom detection circuit 90 detects the absolute minimum level (i.e., the logic 0 level) of the output of the buffer circuit 12, and the peak detection circuit 80 detects the maximum value (i.e., the logic 1 level) of the relative level difference between the output of the buffer circuit 12 and the output of the bottom detection circuit 90. Then, the threshold level is set at the center between the 0 and 1 levels by the resistor voltage divider circuit 40.

As described above, in the second embodiment (modified example) of the signal amplifying circuit of the present invention shown in FIG. 17 (FIG. 19), the capacitor reference terminal of the peak detection circuit 8 (80) is connected to the output of the bottom detection circuit 9 (90), not to the high-level supply voltage Vdd (ground GND) as in the prior art optical receiver circuit (signal amplifying circuit) shown in FIG. 4. Therefore, the peak detection circuit 8 (80) detects the maximum value of the relative level difference between the output of the bottom detection circuit 9 (90) and the output of the amplifying circuit 1 (buffer circuit 12). In this case, even when the output of the bottom detection circuit 9 (90) fluctuates because of the fluctuation of the 0 level, since the diode D1 remains off (unless the change is so great that the 1 level is lower than the 0 level of the previous bit) and the input impedance of the transistor T2 (buffer BF1) is sufficiently high, the charge on the capacitor C1 is retained. As a result, the potential difference between the output of the bottom detection circuit 9 (90) and the output of the peak detection circuit 8 (80) is retained, the output of the peak detection circuit 8 (80) thus being interlocked to the output of the bottom detection circuit 9 (90).

Figure 20:
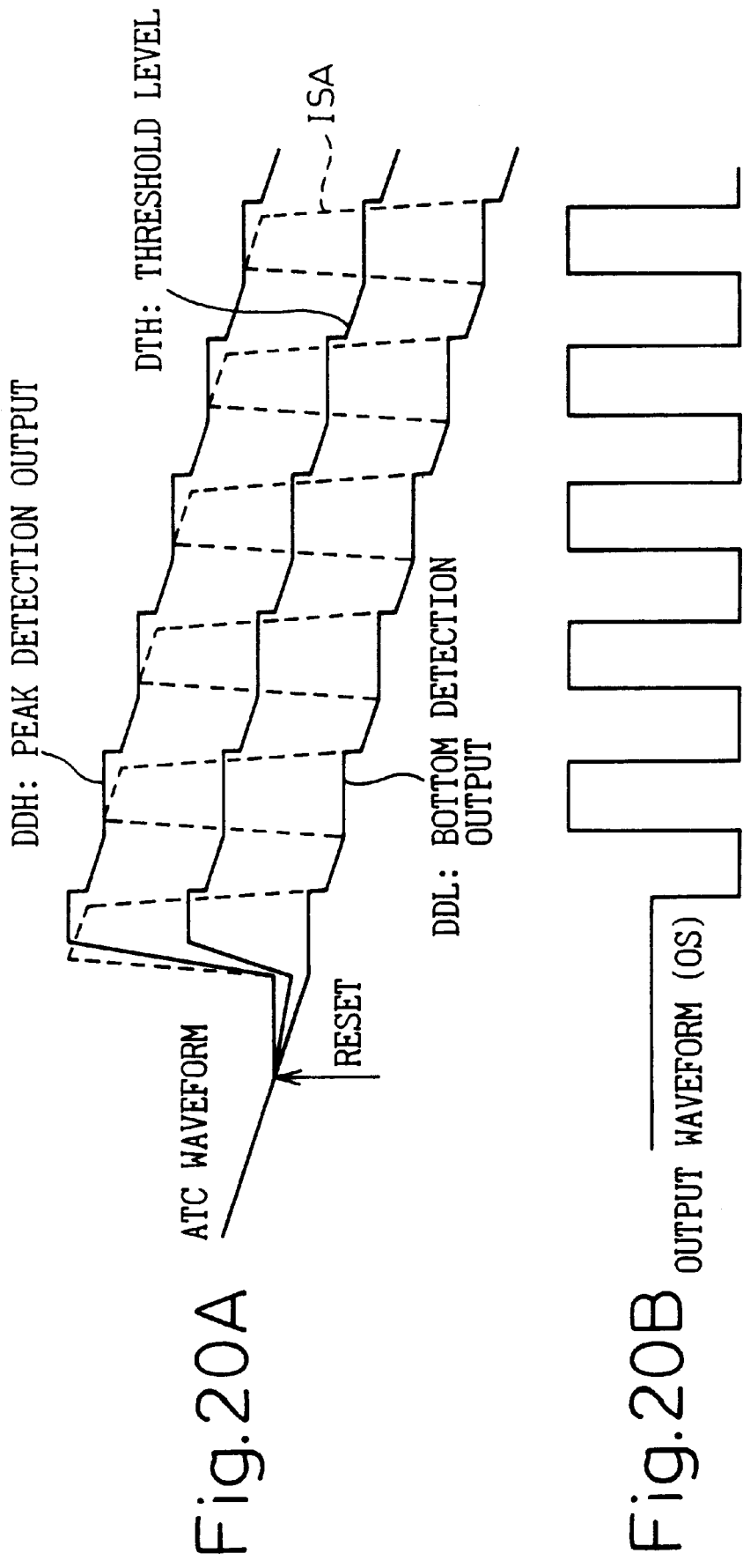
FIGS. 20A and 20B are diagrams for explaining the operation of the signal amplifying circuit shown in FIG. 19.

FIGS. 20A and 20B are diagrams for explaining the operation of the signal amplifying circuit shown in FIG. 19, and correspond to the previously shown diagrams of FIG. 18. Further, FIG. 21 is a diagram showing an operational simulation of the signal amplifying circuit shown in FIG. 19; as can be seen, fundamentally the same waveform as that shown in FIG. 20A can be obtained.

Figure 21:
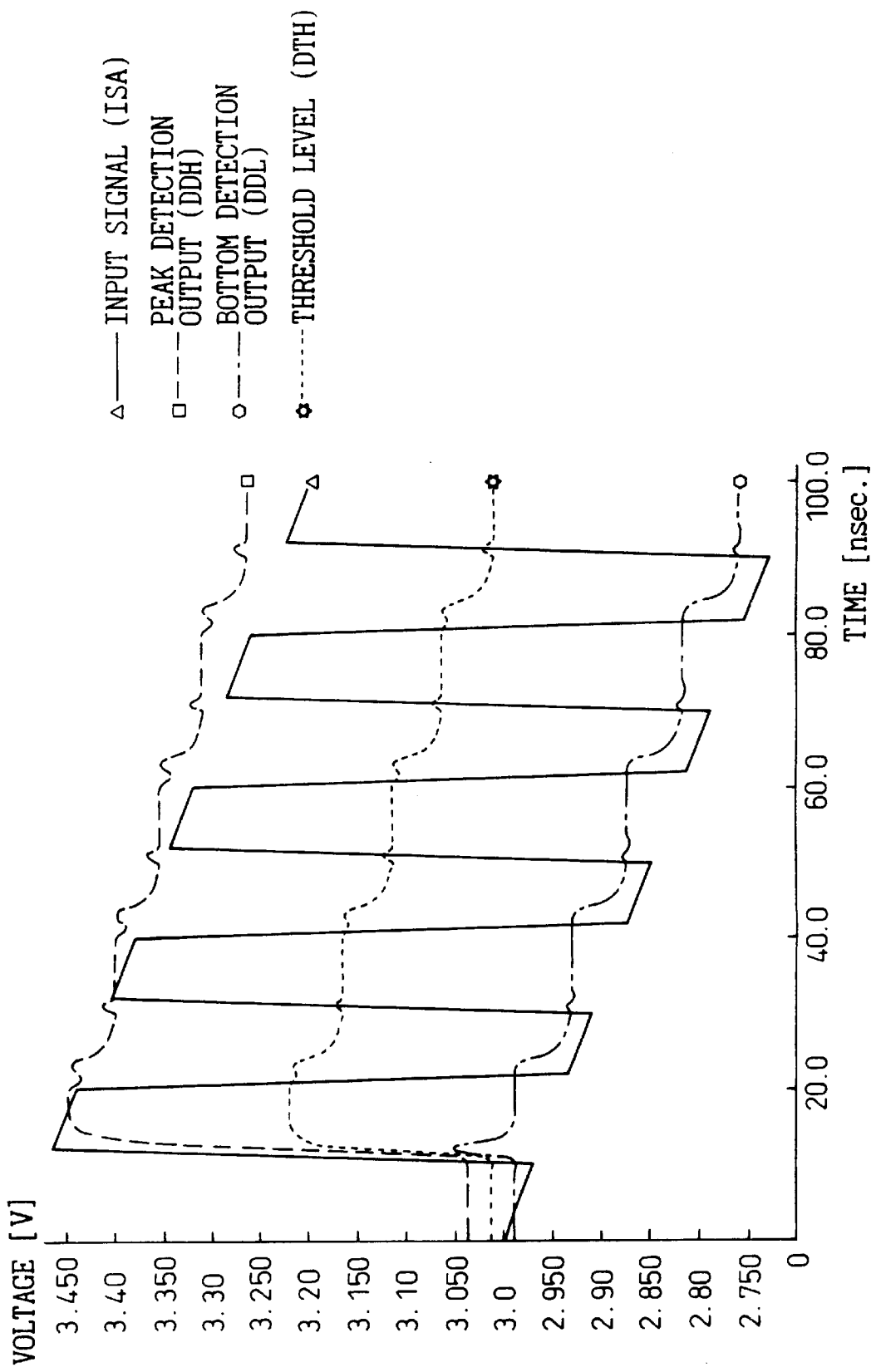
FIG. 21 is a diagram showing an operational simulation of the signal amplifying circuit shown in FIG. 19.

In the modified example also, the capacitor reference terminal of the peak detection circuit 80 is connected to the output of the bottom detection circuit 90, as shown in FIG. 19, so that the peak detection circuit 80 operates to detect the maximum value of the relative level being output from the bottom detection circuit 90; in this way, the threshold level can be set at the center of the signal amplitude regardless of the fluctuation of the 0 level, as shown in FIGS. 20A and 21. As a result, the digital signal can be reproduced accurately at all times, as shown in FIG. 20B, without being affected by variations in the signal amplitude or the DC level of the input signal.

The signal amplifying circuit (optical receiver circuit) shown in FIG. 17 (FIG. 19) can only address situations where the 0 level falls, but since the 0 level fluctuation attributable to the low-frequency response of the photodetector 11 is particularly noticeable in the case of falling, a sufficient effect can be obtained by only addressing level-fall situations.

Figure 22:
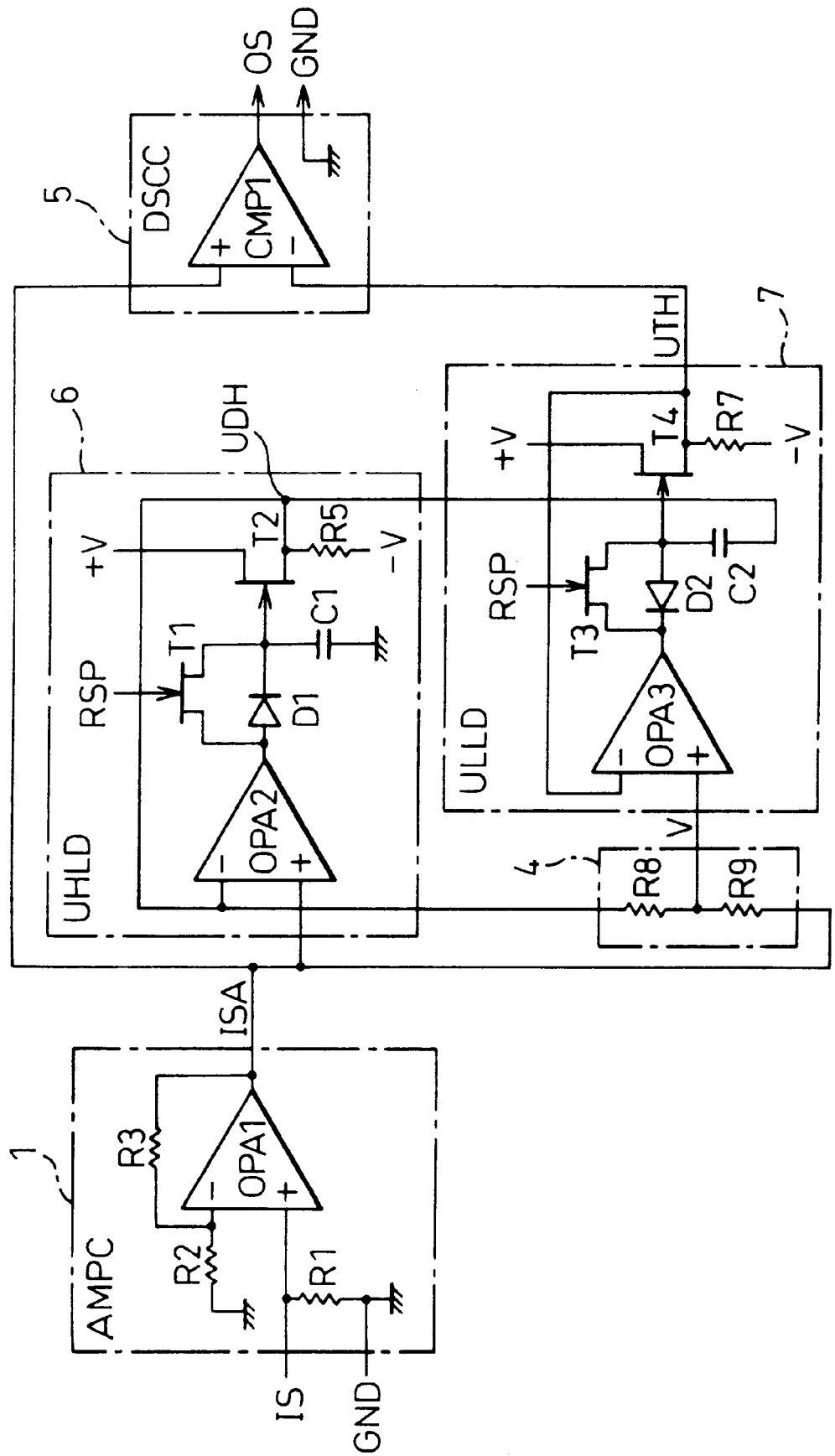
FIG. 22 is a block circuit diagram showing a third embodiment of the signal amplifying circuit according to the present invention.

FIG. 22 is a block circuit diagram showing a third embodiment of the signal amplifying circuit according to the present invention. The third embodiment shown in FIG. 22 can be considered as a modified example of the first embodiment of the signal amplifying circuit shown in FIG. 10, the modification being such that the resistor voltage divider circuit 4 is provided in front of the bottom detection circuit 7.

More specifically, the third embodiment differs from the first embodiment in that the bottom detection is performed after dividing the voltage by 2, whereas in the first embodiment the voltage is divided by 2 after detecting the peak and bottom levels. Here, the resistor voltage divider circuit 4 outputs, for example, a divided voltage signal V=(ISA+UDH)/2, based on the input signal ISA and on the peak detection level UDH from the peak detection circuit 6.

The bottom detection circuit 7, in accordance with the divided voltage signal V (the output voltage of the resistor voltage divider circuit 4), detects and holds the smallest intermediate level UTH in relative terms with respect to the maximum level UDH detected by the peak detection circuit 6. That is, the bottom detection level UTH, which is detected and held, corresponds to the lowest level of relative level differences (equivalent to one half the signal amplitude)

between the maximum level UDH, detected by the peak detection circuit 6, and the divided voltage signal V.

As a result, according to the third embodiment, the output signal OS=1 or 0 can be correctly discriminated at all times, regardless of the amplitude variation of the input signal IS (ISA) or the rise of the DC level thereof. In the third embodiment, the function of resetting the capacitors C1 and C2 is accomplished by bypassing the diodes D1 and D2 by means of MOS or junction field-effect transistors T1 and T3 (66 and 73), as in the peak detection circuit and bottom detection circuit shown in FIGS. 15 and 16. Needless to say, bipolar transistors may be used as the transistors T1 and T3.

Figure 23:
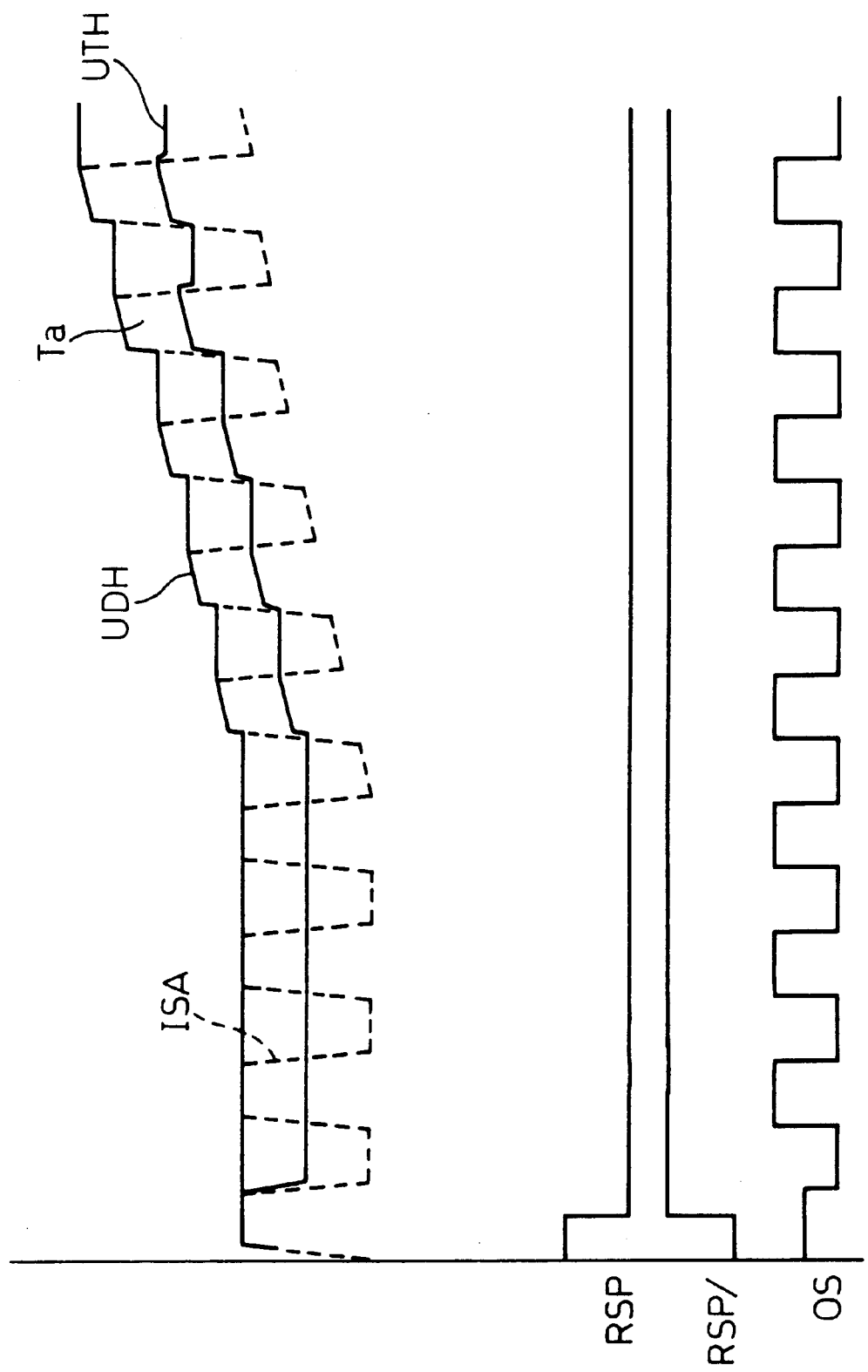
FIG. 23 is a diagram for explaining the operation (waveform response) of the signal amplifying circuit shown in FIG. 22.

FIG. 23 is a diagram for explaining the operation (waveform response) of the signal amplifying circuit shown in FIG. 22.

As shown in FIG. 23, in the initialized condition of the signal amplifying circuit, the peak detection level UDH and the threshold level UTH are both reset to the signal level of the input signal ISA=1 by the reset pulse signal RSP (or RSP/) that occurs, for example, during the period when the input signal ISA=1.

After the above resetting, when the input signal ISA next changes to 0, in the peak detection circuit 6 the capacitor C1 is not charged because ISA<UDH, so that the peak detection level UDH is held at the initial peak detection level UDH. On the other hand, in the bottom detection circuit 7, the capacitor C2 is rapidly discharged, because V<UTH, to approximately the same level as the signal level of the divided voltage signal V at that time.

For a while after that, the above state is maintained, and when the DC level of the input signal ISA begins to rise, in the peak detection circuit 6 the capacitor C1 is charged, because ISA>UDH, to approximately the same level as the signal level of the input signal ISA=1 at that time. As a result, the peak detection level UDH also rises to the signal level of the input signal ISA=1 at that time. In the bottom detection circuit 7, on the other hand, the capacitor C2 is not discharged because V>UTH, but since the peak detection level UDH of the peak detection circuit 6 has risen by an amount equal to the DC drift, the reference side potential of the capacitor C2 is raised by the same amount. As a result, the threshold level UTH is also raised by an amount equal to the DC drift.

In the reproduction circuit 5, therefore, the DC drift is offset, so that the reproduction circuit 5 can correctly discriminate the threshold signal OS=1 or 0 by using the threshold level UTH set at one half the amplitude of the input signal ISA, despite the rise of the DC level. Then, at time Ta in FIG. 23, the signal amplitude of the input signal ISA also begins to increase, but with the charging of the capacitor C1 and the subsequent discharging of the capacitor C2, the increase in the signal amplitude is also followed properly.

Figure 24:
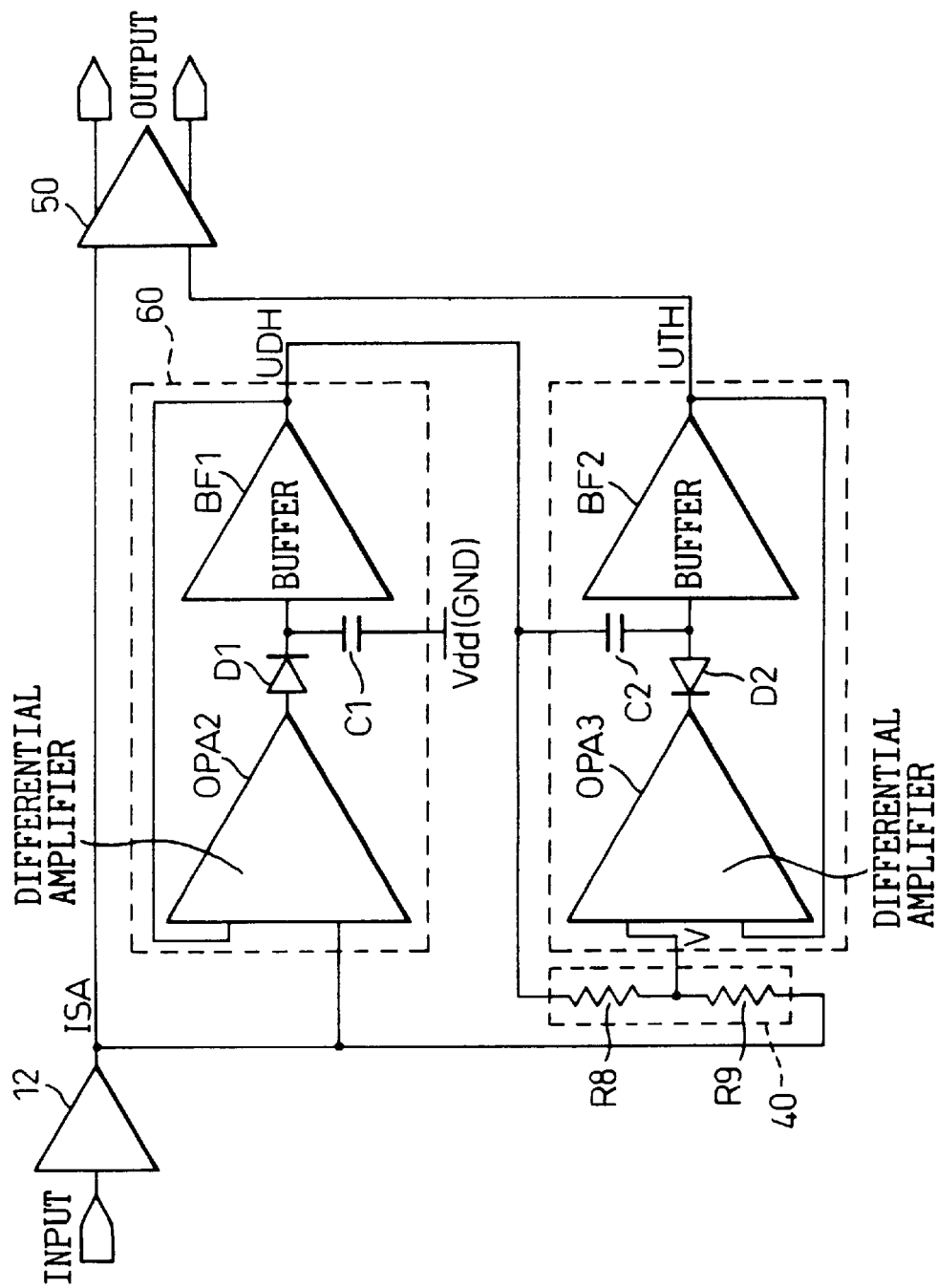
FIG. 24 is a block circuit diagram showing a modified example of the third embodiment of the signal amplifying circuit shown in FIG. 22.

FIG. 24 is a block circuit diagram showing a modified example of the third embodiment of the signal amplifying circuit shown in FIG. 22. The signal amplifying circuit shown in FIG. 24 is configured to address situations where the level rises, and differs from the configuration of FIG. 12 in that the resistor voltage divider circuit 40 is provided in front of the bottom detection circuit 70. In FIG. 24, the photodetector 11 and the preamplifier 10 are not shown. Further, in the peak detection circuit 60, the reference terminal side of the capacitor C1 for detecting and holding the maximum level may be connected to ground (GND) as shown in FIG. 22, but in this modified example, it is connected to the high-level supply voltage (high-level power supply) Vdd.

The peak detection circuit 60 detects the absolute maximum level (logic 1 level) of the output of the buffer circuit 12, and the resistor voltage divider circuit 40 produces a divided voltage signal whose maximum level is approximately equal but whose amplitude is one half. The bottom detection circuit 70 produces a threshold level (UTH) from the minimum value of the relative level difference between the divided voltage signal (V) from the resistor voltage divider circuit 40 and the output (UDH) from the peak detection circuit 60. In this way, the output signal can be correctly discriminated at all times, regardless of the amplitude variation of the input signal ISA or the rise of the DC level thereof.

Figure 25:
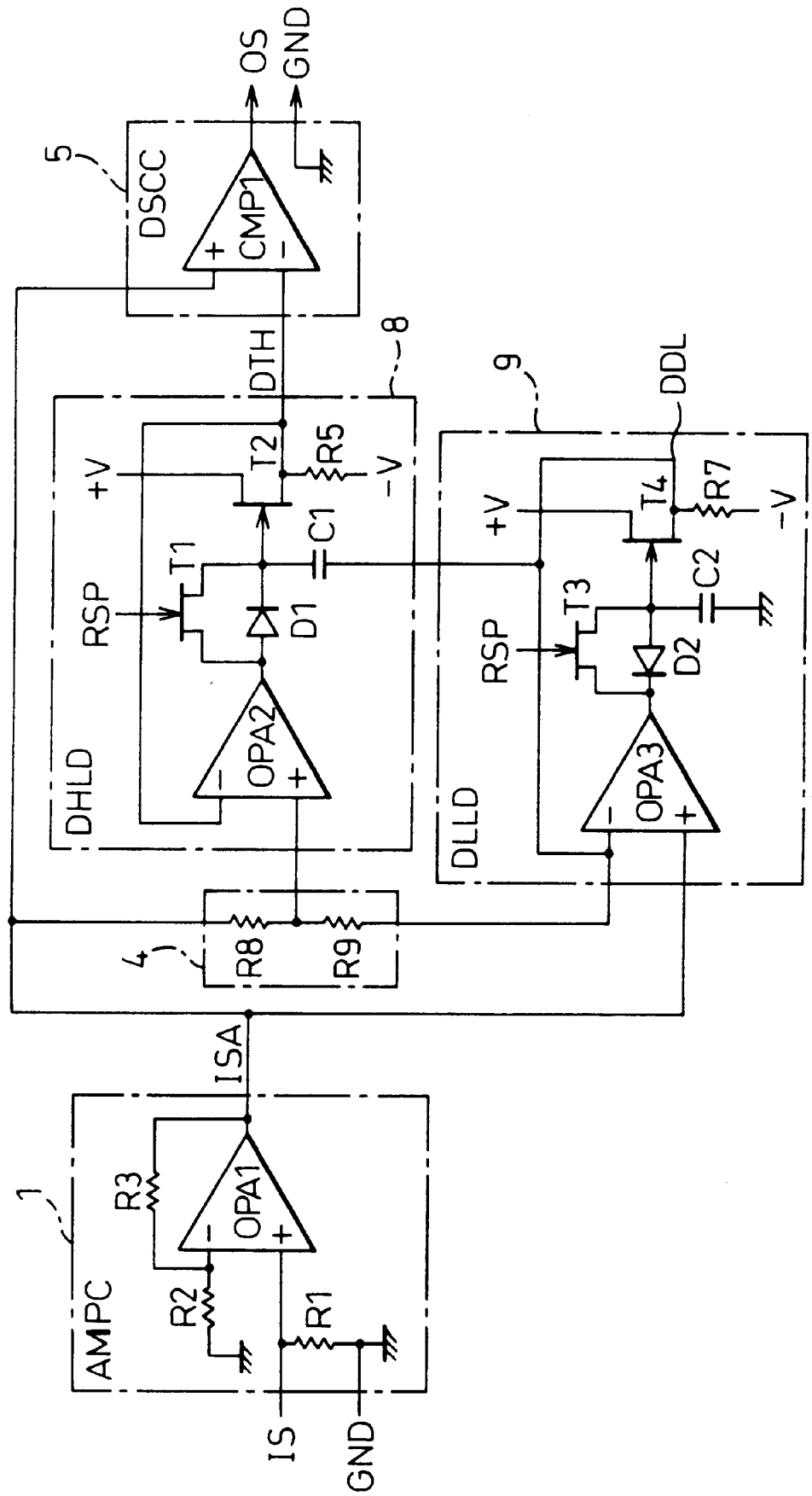
FIG. 25 is a block circuit diagram showing a fourth embodiment of the signal amplifying circuit according to the present invention.

FIG. 25 is a block circuit diagram showing a fourth embodiment of the signal amplifying circuit according to the present invention. The fourth embodiment shown in FIG. 25 can be considered as a modified example of the second embodiment of the signal amplifying circuit shown in FIG. 17, the modification being such that the resistor voltage divider circuit 4 is provided in front of the bottom detection circuit 7, as in the foregoing third embodiment.

More specifically, the fourth embodiment differs from the second embodiment in that the peak detection is performed after dividing the voltage by 2, whereas in the second embodiment the voltage is divided by 2 after detecting the peak and bottom levels. Here, the resistor voltage divider circuit 4 outputs, for example, a divided voltage signal V=(ISA+DDL)/2, based on the input signal ISA and on the bottom detection level DDL from the bottom detection circuit 9.

The peak detection circuit 8, in accordance with the divided voltage signal V (the output voltage of the resistor voltage divider circuit 4), detects and holds the largest intermediate level DTH in relative terms with respect to the minimum level DDL detected by the bottom detection circuit 9. That is, the peak detection level DTH, which is detected and held, corresponds to the highest level of relative level differences (equivalent to one half the signal amplitude) between the minimum level DDL, detected by the bottom detection circuit 9, and the divided voltage signal V.

As a result, according to the fourth embodiment, the output signal OS=1 or 0 can be correctly discriminated at all times, regardless of the amplitude variation of the input signal IS (ISA) or the fall of the DC level thereof.

Figure 26:
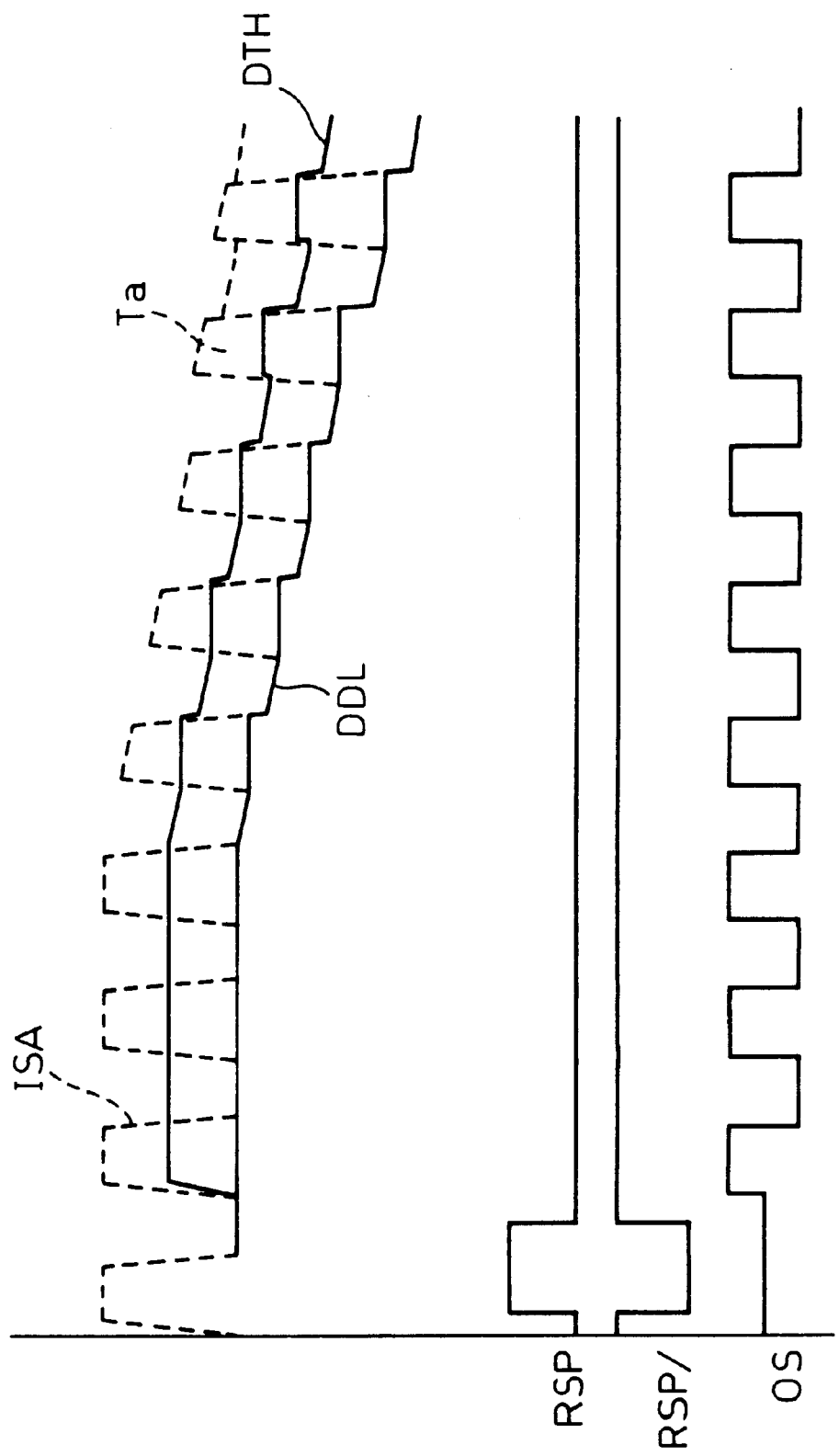
FIG. 26 is a diagram for explaining the operation (waveform response) of the signal amplifying circuit shown in FIG. 25.

FIG. 26 is a diagram for explaining the operation (waveform response) of the signal amplifying circuit shown in FIG. 25.

As shown in FIG. 26, in the initialized condition of the signal amplifying circuit, the bottom detection level DDL and the threshold level DTH are both reset to the signal level of the input signal ISA=0 by the reset pulse signal RSP (or RSP/) that occurs, for example, during the period when the input signal ISA=0.

After the above resetting, when the input signal ISA next changes to 1, in the bottom detection circuit 9 the capacitor C2 is not discharged because ISA>DDL, so that the bottom detection level DDL is held at the initial bottom detection level DDL. On the other hand, in the peak detection circuit 8, the capacitor C1 is rapidly charged, because V>DTH, to approximately the same level as the signal level of the divided voltage signal V at that time.

For a while after that, the above state is maintained, and when the DC level of the input signal ISA begins to fall, in the bottom detection circuit 9 the capacitor C2 is discharged, because ISA<DDL, to approximately the same level as the signal level of the input signal ISA=0 at that time. As a result, the bottom detection level DDL also falls to the signal level of the input signal ISA=0 at that time. In the peak detection circuit 8, on the other hand, the capacitor C1 is not charged because V<DTH, but since the bottom detection level DDL of the bottom detection circuit 9 has fallen by an amount equal to the DC drift, the reference side potential of the capacitor C1 is lowered by the same amount. As a result, the threshold level DTH is also lowered by an amount equal to the DC drift.

In the reproduction circuit 5, therefore, the DC drift is offset, so that the reproduction circuit 5 can correctly discriminate the threshold signal OS=1 or 0 by using the threshold level DTH set at one half the amplitude of the input signal ISA, despite the fall of the DC level. Then, at time Ta in FIG. 26, the signal amplitude of the input signal ISA also begins to increase, but with the charging of the capacitor C1 and the subsequent discharging of the capacitor C2, the increase in the signal amplitude is also followed properly.

Figure 27:
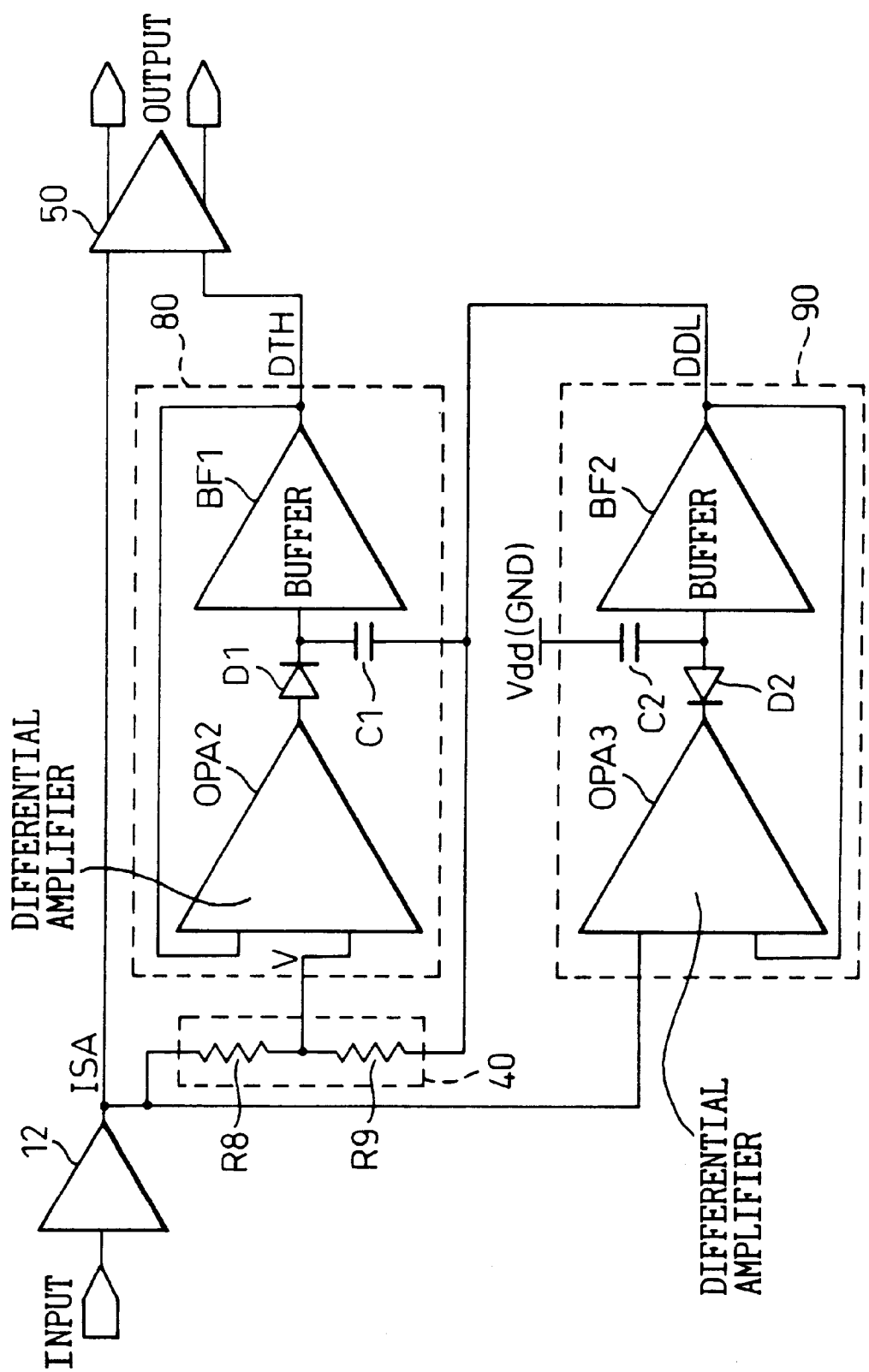
FIG. 27 is a block circuit diagram showing a modified example of the fourth embodiment of the signal amplifying circuit shown in FIG. 25.

FIG. 27 is a block circuit diagram showing a modified example of the fourth embodiment of the signal amplifying circuit (optical receiver circuit) shown in FIG. 25. The signal amplifying circuit shown in FIG. 27 differs from the configuration of FIG. 19 in that the resistor voltage divider circuit 40 is provided in front of the peak detection circuit 80. That is, this modified example is configured to address situations where the level falls, by reversing the relationship between the peak level detection and bottom level detection in the modified example of FIG. 24. In FIG. 27 also, the photodetector 11 and the preamplifier 10 are not shown. Further, in the bottom detection circuit 90, the reference terminal side of the capacitor C2 for detecting and holding the minimum level may be connected to ground (GND) as shown in FIG. 25, but in this modified example, it is connected to the high-level supply voltage (high-level power supply) Vdd.

The bottom detection circuit 90 detects the absolute minimum level (logic 0 level) of the output of the buffer circuit 12, and the resistor voltage divider circuit 40 produces a divided voltage signal whose minimum level is approximately equal but whose maximum amplitude is one half. The peak detection circuit 80 produces a threshold level (DTH) from the maximum value of the relative level difference between the divided voltage signal (V) from the resistor voltage divider circuit 40 and the output (DDL) from the bottom detection circuit 90. In this way, the output signal can be correctly discriminated at all times, regardless of the amplitude variation of the input signal ISA or the fall of the DC level thereof.

The signal amplifying circuits (optical receiver circuits) so far described have been configured to address the amplitude variation of the input signal and either the fall or rise of the DC level thereof, but in cases where whether the level rises or falls is unpredictable, for example, as in the case of power supply noise, both the rise and fall of the level must be addressed. That is, the DC level can change in the increasing direction or in the decreasing direction; in cases where its change is rapid in both directions, the signal amplifying circuit of the following embodiment is effective. In such cases, whether the change in the increasing direction is rapid or the change in the decreasing direction is rapid may be predictable, depending on the signal transmission system characteristics, etc., but there are also cases where the change is rapid in both directions.

In such cases, as will be described below, two ATC circuits are provided, one for addressing a level fall and the other for a level rise, and by monitoring the variation of the DC level at shorter intervals of time than the variation cycle of the DC level, the output of one or the other of the ATC circuits is selected according to the level variation.

Figure 28:
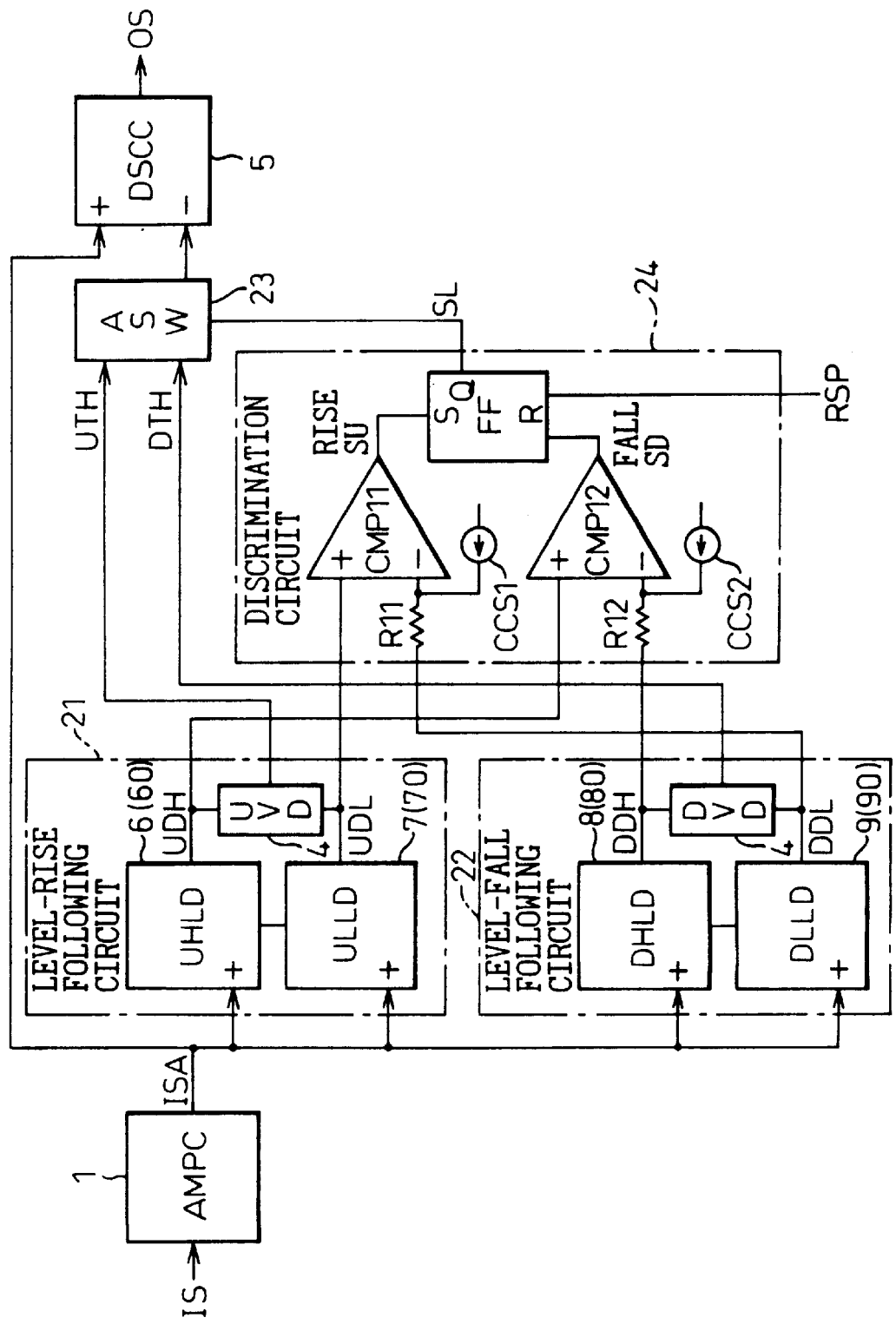
FIG. 28 is a block circuit diagram showing a fifth embodiment of the signal amplifying circuit according to the present invention.

FIG. 28 is a block circuit diagram showing a fifth embodiment of the signal amplifying circuit according to the present invention. In FIG. 28, reference numeral 21 is a level-rise following circuit, 22 is a level-fall following circuit, 23 is an analog switch circuit (ASW), and 24 is a discrimination circuit.

The level-rise following circuit 21 comprises, for example, the peak detection circuit 6 (60), the bottom detection circuit 7 (70), and the resistor voltage divider circuit 4, used in the first embodiment (modified example) of the present invention shown in FIG. 10 (FIG. 12), and the level-fall following circuit 22 comprises, for example, the peak detection circuit 8 (80), the bottom detection circuit 9 (90), and the resistor voltage divider circuit 4, used in the second embodiment (modified example) of the present invention shown in FIG. 17 (FIG. 19).

The discrimination circuit 24 discriminates whether the DC level of the input signal ISA is rising or falling, based on the peak detection levels UDH and DDH and bottom detection levels UDL and DDL from the level-rise following circuit 21 and level-fall following circuit 22, and generates a selection control signal SL which is supplied to the analog switch circuit 23.

More specifically, the discrimination circuit 24 comprises comparators CMP11 and CMP12, and a flip-flop (SR flip-flop) circuit FF. The bottom detection level UDL from the level-rise following circuit 21 is applied to an input of the comparator CMP11, and the bottom detection level DDL from the level-fall following circuit 22 is applied via a resistor R11 to an inverting input of the same comparator CMP11. Likewise, the peak detection level UDH from the level-rise following circuit 21 is applied to an input of the comparator CMP12, and the bottom detection level DDH from the level-fall following circuit 22 is applied via a resistor R12 to an inverting input of the same comparator CMP12.

In the discrimination circuit 24, the comparator CMP11 compares UDL and DDL and, when UDL>DDL, outputs a level-rise detection signal SU, by which the flip-flop circuit FF is forcefully set. This causes the analog switch circuit 23 to select the threshold level UTH from the level-rise following circuit 21.

Likewise, the comparator CMP12 compares UDH and DDH and, when UDH>DDH, outputs a level-fall detection signal SD, by which the flip-flop circuit FF is forcefully reset. This causes the analog switch circuit 23 to select the threshold level DTH from the level-fall following circuit 22.

Here, in the state immediately after the initialization of the signal amplifying circuit described above, the output of the comparator CMP11 is unstable because UDL=DDL, but in the fifth embodiment, since the series resistor R11 is inserted in the line to the inverting input terminal of the comparator CMP11, and constant current is supplied to the inverting input terminal by a constant current source CCS1, the inverting input terminal is biased in the positive direction so that the instability is eliminated. The same applies to the comparator CMP12. Further, by introducing hysteresis in the characteristics of the comparators CMP11 and COMP12, their outputs can be prevented from becoming unstable due to noise, etc.

In an apparatus incorporating the signal amplifying circuit of the fifth embodiment of the present invention, the necessary reset pulse signals RSP and RSP/ are generated, for example, at power on to the apparatus, at the start of each transmitted frame (or between each frame), or at suitable intervals of time shorter than the variation cycle of the DC level, to initialize the peak detection circuits 6, 8 and bottom detection circuits 7, 9.

In practical applications, there can be cases where the variation magnitude of the DC level of the input signal ISA becomes several times greater than the signal amplitude (for example, 100 mV$_{p-p}$), depending on the apparatus used, but even in such cases, by generating the reset pulse signals at suitable times, the level detection operation in each interval can be started from the DC level of the input signal ISA at the respective times, and the variation magnitude of the DC level in each interval can thus be reduced. This is also true of the first to fourth embodiments previously described.

Figures 29A, 29B:
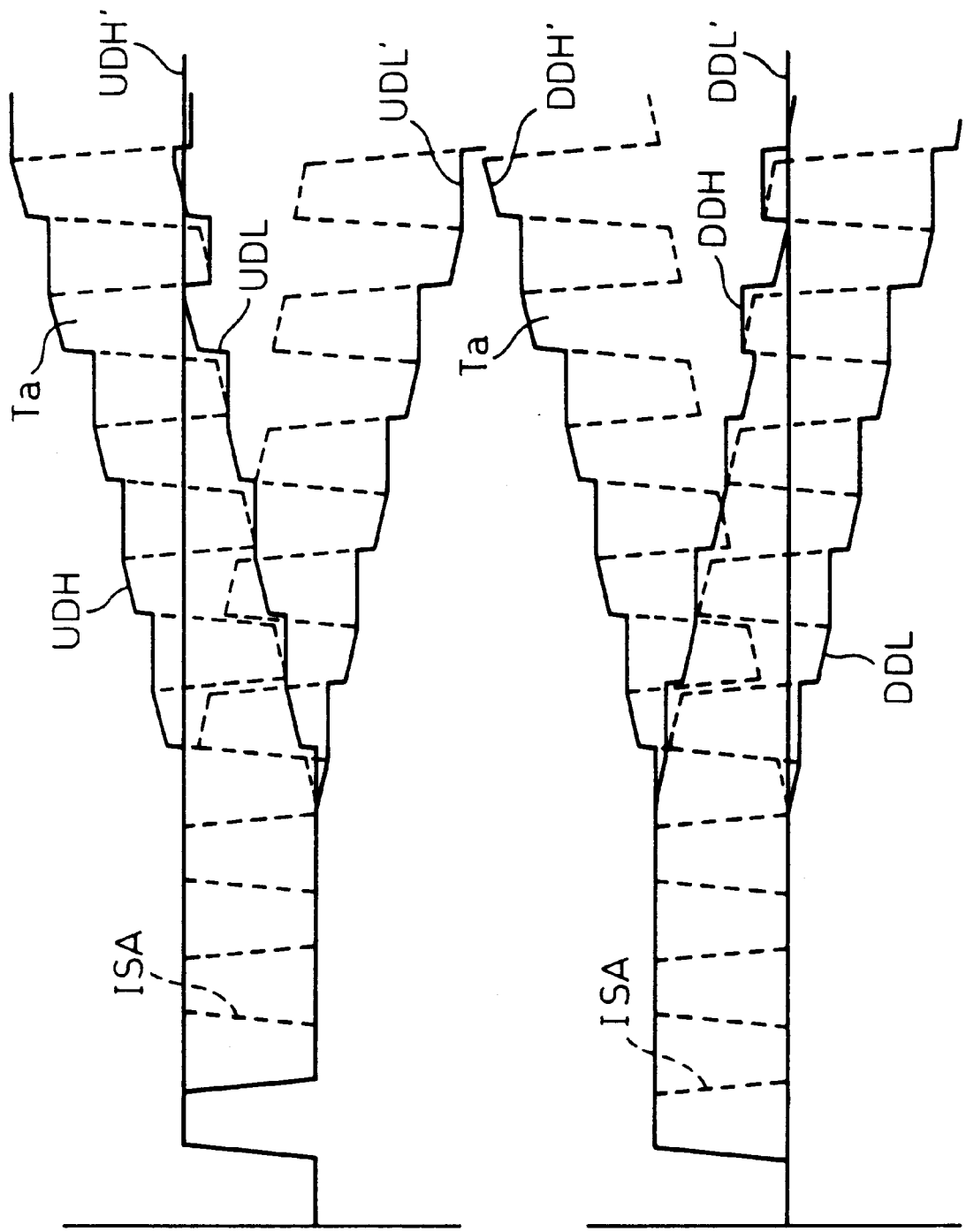
FIGS. 29A and 29B are diagrams for explaining the operation of the signal amplifying circuit shown in FIG. 28.

FIGS. 29A and 29B are diagrams for explaining the operation of the signal amplifying circuit shown in FIG. 28: FIG. 29A shows the operation of the level-rise following circuit 21, and FIG. 29B depicts the operation of the level-fall following circuit 22.

In the state immediately after initialization, the level-rise following circuit 21 and the level-fall following circuit 22 are both operating in the same condition, and actually, either threshold level, UTH or DTH, can be used. In the fifth embodiment, however, the threshold level DTH from the level-fall following circuit 22 is used in preference to the other, by forcefully resetting the flip-flop circuit FF by the reset pulse signal RSP.

This initial setting considers the fact that the DC level of the input signal ISA in the apparatus tends to fall easily (the change in the decreasing direction is greater), if anything; therefore, this initial setting has the effect of reducing the frequency of switching of the analog switch circuit 23. On the other hand, in applications where the DC level of the input signal ISA tends to easily rise (the change in the increasing direction is greater), provisions should be made to forcefully set the flip-flop circuit FF by the reset pulse signal RSP.

As shown in FIG. 29A, if the DC level of the input signal ISA begins to rise at some intermediate point in time, for example, in the level-rise following circuit 21 both the peak detection level UDH and the bottom detection level UDL rise. On the other hand, in the level-fall following circuit 22, as shown in FIG. 29B, the peak detection level DDH' rises, as does the peak detection level UDH in the level-rise following circuit 21, but the bottom detection level DDL' remains at the initial bottom detection level. Accordingly, by detecting the relation UDL>DDL', the rise of the DC level can be detected properly.

Conversely, if the DC level of the input signal ISA begins to fall at some intermediate point in time, for example, in the level-fall following circuit 22 both the peak detection level DDH and the bottom detection level DDL fall. On the other hand, in the level-rise following circuit 21, the bottom detection level UDL' falls, as does the bottom detection level DDL in the level-fall following circuit 22, but the peak detection level UDH' remains at the initial detection level. Accordingly, by detecting the relation UDH'>DDH, the fall of the DC level can be detected properly.

FIG. 30 is a diagram for explaining a modified example of the signal amplifying circuit operation (in the case of a level rise) shown in FIGS. 29A and 29B.

When the level is rising as shown in FIG. 30 (FIG. 29A), the level-rise and level-fall following peak detection circuits 6 (60) and 8 (80) and the level-rise following bottom detection circuit 7 (70) follow the rising level, whereas the level-fall following bottom detection circuit 9 (90) does not follow the level but detects and holds the absolute minimum value. Whether the level is rising or not can therefore be determined by comparing the output of the level-rise following bottom detection circuit 7 (70) with the output of the level-fall following bottom detection circuit 9 (90). That is, by detecting the output of the comparator CMP12 changing from a low level to a high level, the threshold level from the level-rise following circuit 21 is selected by the analog switch 23 and supplied to the reproduction circuit 5.

In the example shown in FIG. 30, the output of the level-fall following bottom detection circuit 9 (90) is slightly biased so that the output of the comparater CMP12 is not unstable by noise when the output of the level-fall following bottom detection circuit 9 (90) and the level-rise following bottom detection circuit 7 (70) is approximately equal. Furthermore, hysteresis may be introduced to stabilize the output of the comparing circuit (comparator CMP12). This also applies to the case of a level fall.

Further, in FIG. 30, with the first bit immediately after the reset, the output of the comparator CMP12 goes high because the level-rise following bottom detection circuit 7 (70) follows the output of the level-rise following peak detection circuit 6 (60), but since the operation is unstable for the period of several bits immediately after the reset, such time period is masked to ignore the change of state during that period to prevent an erroneous operation.

The above-described fifth embodiment can address the variation of the state immediately after resetting only in one direction, either upward or downward, but in reality, variations whose direction of change, upward or downward, is unpredictable are usually slow variations such as in temperature and supply voltage, and such variations can be addressed by inserting a reset at sufficiently short intervals of time.

Figure 31:
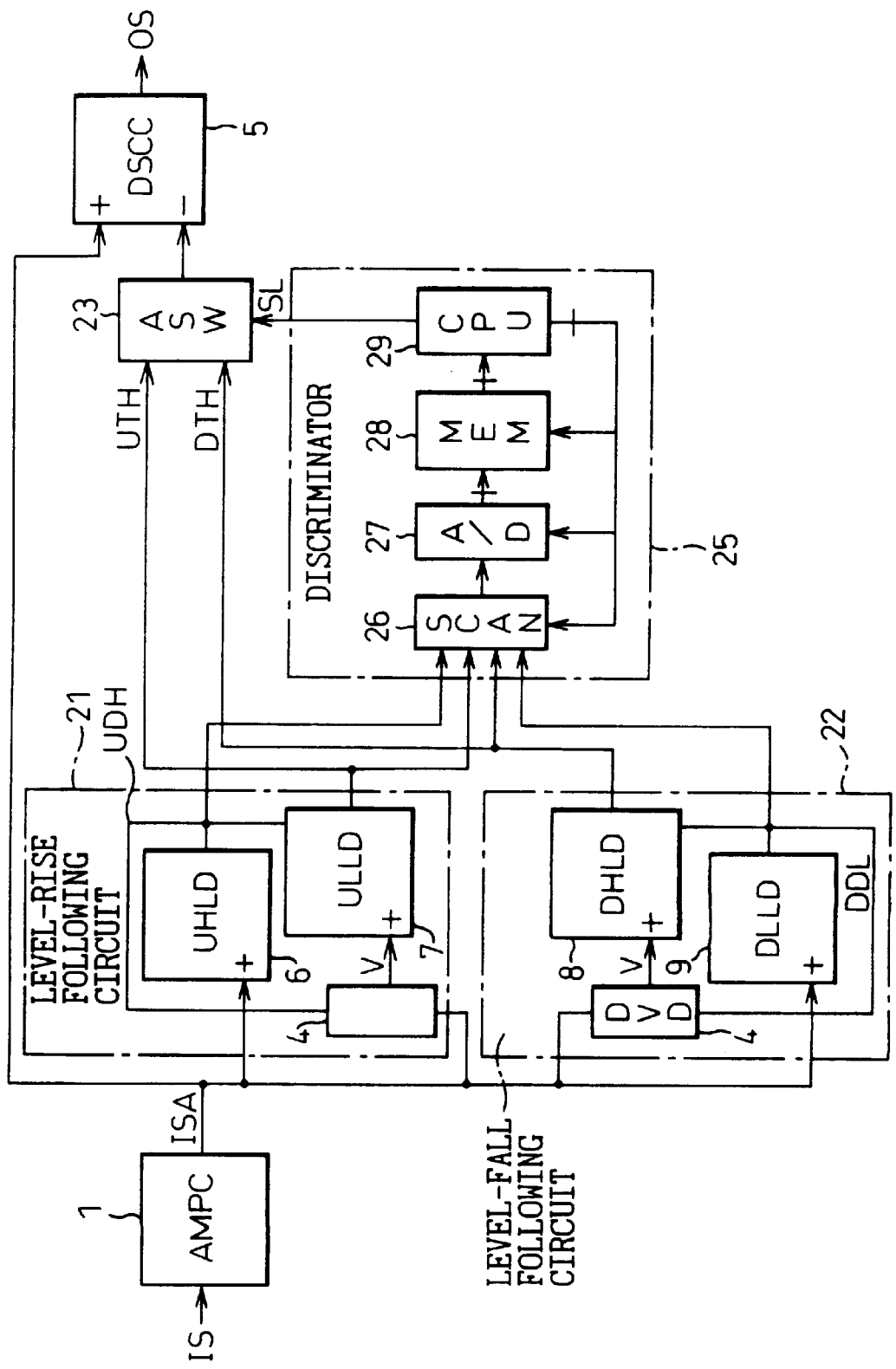
FIG. 31 is a block circuit diagram showing a sixth embodiment of the signal amplifying circuit according to the present invention.

FIG. 31 is a block circuit diagram showing a sixth embodiment of the signal amplifying circuit according to the present invention. In FIG. 31, reference numeral 21 is a level-rise following circuit, 22 is a level-fall following circuit, 23 is an analog switch circuit (ASW), 25 is a discriminator, 26 is a scanner circuit (SCAN), 27 is an A/D converter, 28 is a memory (MEM), and 29 is a microprocessor (CPU).

The level-rise following circuit 21 comprises the peak detection circuit 6, the bottom detection circuit 7, and the resistor voltage divider circuit 4, used in the first or third embodiment (or their modified examples). The level-fall following circuit 22 comprises the peak detection circuit 8, the bottom detection circuit 9, and the resistor voltage divider circuit 4, used in the second or fourth embodiment (or their modified examples).

The discriminator 25, based on the supervisory signals (i.e., peak detection level, bottom detection level, and/or threshold level) from the level-rise following circuit 21 and level-fall following circuit 22, discriminates whether the DC level of the input signal ISA is rising or falling, and generates a selection control signal SL which is supplied to the analog switch circuit 23.

In this case, by A/D converting the supervisory signals for digital signal processing, the state of change of the DC level can be detected with high reliability in various ways.

More specifically, the CPU 29 scans (26) the supervisory signals at high speed in a time division fashion, and A/D converts (27) the signals for storage in the memory 28. By repeating this operation at prescribed time intervals, the change of each supervisory signal can be obtained in a time series. The CPU 29 determines the tendency of the DC level change by examining the change (transition) of each supervisory signal.

Figures 32A, 32B:
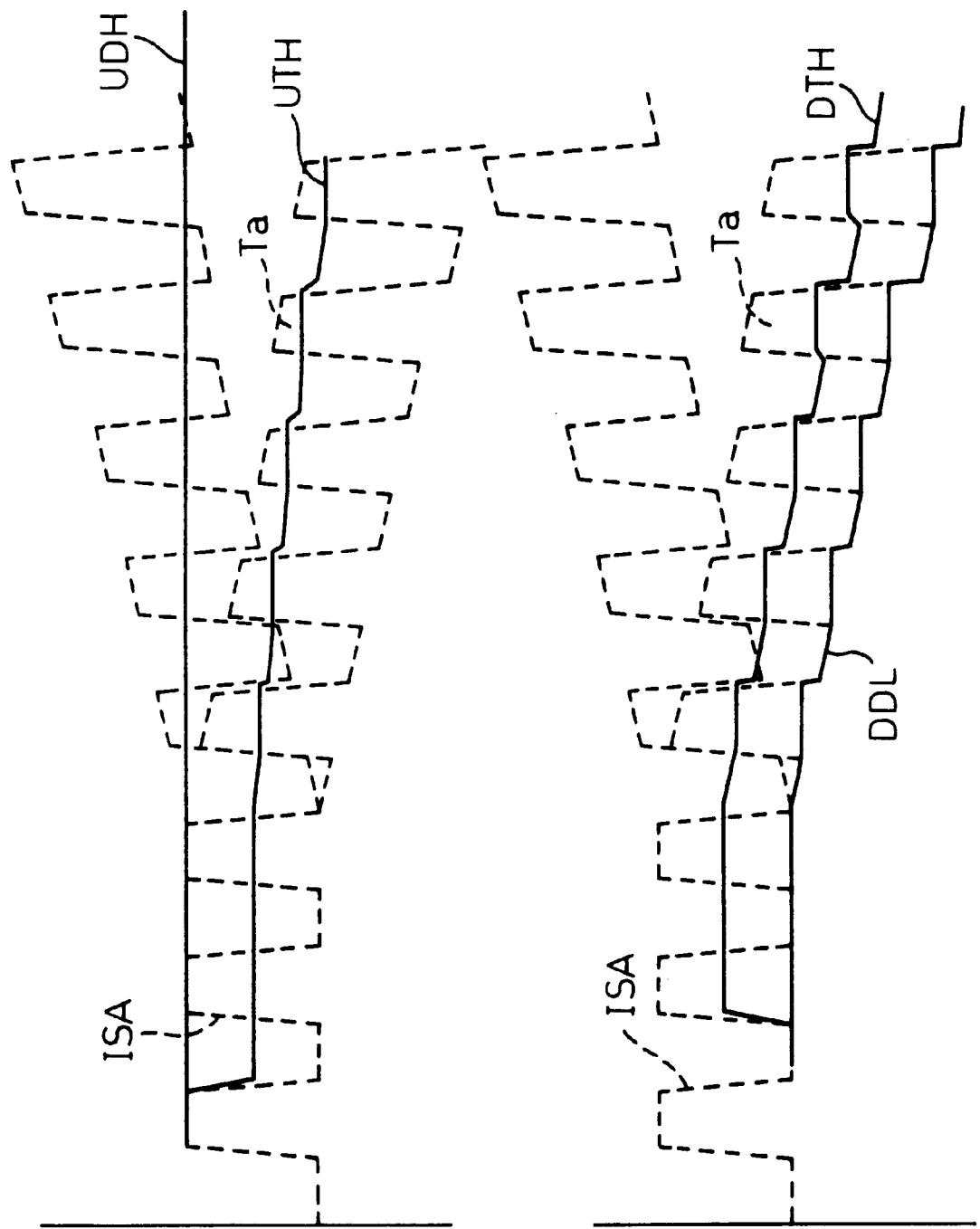
FIGS. 32A and 32B are diagrams for explaining the operation of the signal amplifying circuit shown in FIG. 31.

FIGS. 32A and 32B are diagrams for explaining the operation of the signal amplifying circuit shown in FIG. 31: FIG. 32A shows the operation of the level-rise following circuit 21, and FIG. 32B depicts the operation of the level-fall following circuit 22.

When no change (slope) is observed in the peak detection level UDH (or DDH) and bottom detection level UDL (or DDL), or in the threshold levels UTH and DTH, etc., for example, it can be determined that there is no change in the DC level. Also, when changes are detected in the peak detection level UDH and the bottom detection level DDL, for example, if these levels are changing in opposite directions, this indicates that the signal amplitude is increasing, and it can be determined that there is no change in the DC level.

Further, when the peak detection levels UTH and DTH are both rising, for example, it can be determined that the DC level is changing upward; when the peak detection levels UTH and DTH are both falling, then it can be determined that the DC level is changing downward. By performing recognition of various patterns associated with time-series changes of the respective supervisory signals, including the above-stated change patterns, highly reliable, accurate discrimination can be performed. The operation of the sixth embodiment involves discriminating between the level rise and fall by digitally processing the variation of each output level, and achieves accurate discrimination compared with the fifth embodiment shown in FIG. 28, though the circuit size increases.

The ATC circuit such as that shown in the third and fourth embodiments (and their modified examples) does not output a common level and, therefore, is difficult to apply to the fifth embodiment to perform comparisons on the analog level. On the other hand, if a storage device (memory) 28 is provided, as in the sixth embodiment, the variation can be discriminated by comparison with the previous levels; in the sixth embodiment, therefore, the ATC circuit such as shown in the third and fourth embodiments (and their modified examples) can be applied.

Each of the above embodiments (and their modified examples) has been described by taking clock signal reproduction as an example, but it will be appreciated that the present invention is also applicable for the reproduction of the more general digital signals (data signals, pulse signals, etc.). Further, in each of the above embodiments, the threshold level has been set to a center value between the peak detection level and the bottom detection level, but it may be set to an appropriate value intermediate between them.

As described in detail above, according to the present invention, a signal amplifying circuit is provided that can accurately reproduce digital signals at all times, regardless of variations in the amplitude or the DC level of the input signal. Furthermore, the signal amplifying circuit can be constructed with simple circuitry suitable for LSI implementation and can be provided in a low-cost configuration requiring fewer external components.

Many different embodiments of the present invention may be constructed without departing from the spirit and scope of the present invention, and it should be understood that the present invention is not limited to the specific embodiments described in this specification, except as defined in the appended claims.

What is claimed is:

1. An automatic threshold control circuit comprising:
   an absolute peak detection circuit to detect an absolute maximum level of an input signal;
   a relative bottom detection circuit to detect, in accordance with said input signal, a minimum level relative to the absolute maximum level detected by said absolute peak detection circuit; and
   a voltage divider circuit to generate a threshold level by dividing said absolute maximum level and said relative minimum level in a predetermined ratio.

2. An automatic threshold control circuit as claimed in claim 1, wherein said relative bottom detection circuit includes a capacitor, to hold said relative minimum level, having a reference terminal connected to an output terminal of said absolute peak detection circuit.

3. An automatic threshold control circuit as claimed in claim 1, wherein said absolute peak detection circuit includes a capacitor, to hold said absolute maximum level, having a reference terminal connected to a prescribed reference level line.

4. An automatic threshold control circuit comprising:
   an absolute peak detection circuit for detecting an absolute maximum level of an input signal;
   a voltage divider circuit for generating a divided voltage signal by dividing said absolute maximum level, detected by said absolute peak detection circuit, and said input signal in a predetermined ratio; and
   a relative bottom detection circuit for generating, in accordance with said divided voltage signal, a threshold level from a minimum level relative to said absolute maximum level detected by said absolute peak detection circuit.

5. An automatic threshold control circuit as claimed in claim 4, wherein in said relative bottom detection circuit, a reference terminal of a capacitor for holding said relative minimum level is connected to an output terminal of said absolute peak detection circuit.

6. An automatic threshold control circuit as claimed in claim 4, wherein in said absolute peak detection circuit, a reference terminal of a capacitor for holding said absolute maximum level is connected to a prescribed reference level line.

7. An automatic threshold control circuit comprising:
   an absolute bottom detection circuit to detect an absolute minimum level of an input signal;
   a relative peak detection circuit to detect, in accordance with said input signal, a maximum level relative to the absolute minimum level detected by said absolute bottom detection circuit; and
   a voltage divider circuit to generate a threshold level by dividing said absolute minimum level and said relative maximum level in a predetermined ratio.

8. An automatic threshold control circuit as claimed in claim 7, wherein said relative peak detection circuit includes a capacitor, to hold said relative maximum level, having a reference terminal connected to an output terminal of said absolute bottom detection circuit.

9. An automatic threshold control circuit as claimed in claim 7, wherein said absolute bottom detection circuit includes a capacitor, to hold said absolute minimum level, having a reference terminal connected to a prescribed reference level line.

10. An automatic threshold control circuit comprising:
    an absolute bottom detection circuit for detecting an absolute minimum level of an input signal;

a voltage divider circuit for generating a divided voltage signal by dividing said absolute minimum level, detected by said absolute bottom detection circuit, and said input signal in a predetermined ratio; and a relative peak detection circuit for generating, in accordance with said divided voltage signal, a threshold level from a maximum level relative to said absolute minimum level detected by said absolute bottom detection circuit.

11. An automatic threshold control circuit as claimed in claim 10, wherein in said relative peak detection circuit, a reference terminal of a capacitor for holding said relative maximum level is connected to an output terminal of said absolute bottom detection circuit.

12. An automatic threshold control circuit as claimed in claim 10, wherein in said absolute bottom detection circuit, a reference terminal of a capacitor for holding said absolute minimum level is connected to a prescribed reference level line.

13. A signal amplifying circuit having an automatic threshold control circuit and a reproduction circuit for discriminating an input signal by using a threshold level supplied from said automatic threshold control circuit, wherein said automatic threshold control circuit comprises:

an absolute peak detection circuit to detect an absolute maximum level of said input signal;

a relative bottom detection circuit to detect, in accordance with said input signal, a minimum level relative to the absolute maximum level detected by said absolute peak detection circuit; and a voltage divider circuit to generate said threshold level by dividing said absolute maximum level and said relative minimum level in a predetermined ratio.

14. An automatic threshold control circuit as claimed in claim 13, wherein said relative bottom detection circuit includes a capacitor, to hold said relative minimum level, having a reference terminal connected to an output terminal of said absolute peak detection circuit.

15. A signal amplifying circuit as claimed in claim 13, wherein said absolute peak detection circuit includes a capacitor to hold said absolute maximum level, having a reference terminal connected to a prescribed reference level line.

16. A signal amplifying circuit comprising:

an automatic threshold control circuit to supply a threshold level;

a reproduction circuit to discriminate an input signal of said signal amplifying circuit using the threshold level supplied from said automatic threshold control circuit;

a photodetector to convert an optical signal into an electric current signal; and a preamplifier to amplify said electric current signal and output a corresponding voltage signal that is the input signal of the signal amplifying circuit, wherein said automatic threshold control circuit comprises:

an absolute peak detection circuit to detect an absolute maximum level of said input signal of said signal amplifying circuit;

a relative bottom detection circuit to detect, in accordance with said input signal of said signal amplifying circuit, a minimum level relative to the absolute maximum level detected by said absolute peak detection circuit; and a voltage divider circuit to generate said threshold level by dividing said absolute maximum level and said relative minimum level in a predetermined ratio.

17. A signal amplifying circuit having an automatic threshold control circuit and a reproduction circuit for discriminating an input signal by using a threshold level supplied from said automatic threshold control circuit, wherein said automatic threshold control circuit comprises:

an absolute peak detection circuit for detecting an absolute maximum level of said input signal;

a voltage divider circuit for generating a divided voltage signal by dividing said absolute maximum level, detected by said absolute peak detection circuit, and said input signal in a predetermined ratio; and a relative bottom detection circuit for generating, in accordance with said divided voltage signal, said threshold level from a minimum level relative to said absolute maximum level detected by said absolute peak detection circuit.

18. A signal amplifying circuit as claimed in claim 17, wherein in said relative bottom detection circuit, a reference terminal of a capacitor for holding said relative minimum level is connected to an output terminal of said absolute peak detection circuit.

19. A signal amplifying circuit as claimed in claim 17, wherein in said absolute peak detection circuit, a reference terminal of a capacitor for holding said absolute maximum level is connected to a prescribed reference level line.

20. A signal amplifying circuit comprising:

an automatic threshold control circuit to supply a threshold level;

a reproduction circuit to discriminate an input signal of said signal amplifying circuit using the threshold level supplied from said automatic threshold control circuit;

a photodetector to convert an optical signal into an electric current signal; and a preamplifier to amplify said electric current signal and output a corresponding voltage signal that is the input signal of the signal amplifying circuit, wherein said automatic threshold control circuit comprises:

an absolute peak detection circuit to detect an absolute maximum level of said signal amplifying circuit input;

a voltage divider circuit to generate a divided voltage signal by dividing said absolute maximum level, detected by said absolute peak detection circuit, and said signal amplifying circuit input in a predetermined ratio; and a relative bottom detection circuit to generate, in accordance with said divided voltage signal, said threshold level from a minimum level relative to said absolute maximum level detected by said absolute peak detection circuit.

21. A signal amplifying circuit having an automatic threshold control circuit and a reproduction circuit for discriminating an input signal of said signal amplifying circuit by using a threshold level supplied from said automatic threshold control circuit, wherein said automatic threshold control circuit comprises:

an absolute bottom detection circuit to detect an absolute minimum level of said input signal;

a relative peak detection circuit to detect, in accordance with said input signal, a maximum level relative to the absolute minimum level detected by said absolute bottom detection circuit; and a voltage divider circuit to generate said threshold level by dividing said absolute minimum level and said relative maximum level in a predetermined ratio.

22. A signal amplifying circuit as claimed in claim 21, wherein said relative peak detection circuit includes a capacitor, to hold said relative maximum level, having a reference terminal connected to an output terminal of said absolute bottom detection circuit.

23. A signal amplifying circuit as claimed in claim 21, wherein said absolute bottom detection circuit includes a capacitor, to hold said absolute minimum level, having a reference terminal connected to a prescribed reference level line.

24. A signal amplifying circuit comprising:
an automatic threshold control circuit to supply a threshold level;
a reproduction circuit to discriminate an input signal of said signal amplifying circuit using the threshold level supplied from said automatic threshold control circuit;
a photodetector to convert an optical signal into an electric current signal; and
a preamplifier to amplify said electric current signal and output a corresponding voltage signal that is the input signal of said signal amplifying circuit, wherein said automatic threshold control circuit comprises:
an absolute bottom detection circuit to detect an absolute minimum level of said input signal of said signal amplifying circuit;
a relative peak detection circuit to detect, in accordance with said input signal of said signal amplifying circuit, a maximum level relative to the absolute minimum level detected by said absolute bottom detection circuit; and
a voltage divider circuit to generate said threshold level by dividing said absolute minimum level and said relative maximum level in a predetermined ratio.

25. A signal amplifying circuit having an automatic threshold control circuit and a reproduction circuit for discriminating an input signal of said signal amplifying circuit by using a threshold level supplied from said automatic threshold control circuit, wherein said automatic threshold control circuit comprises:
an absolute bottom detection circuit to detect an absolute minimum level of said input signal of said signal amplifying circuit;
a voltage divider circuit to generate a divided voltage signal by dividing said absolute minimum level, detected by said absolute bottom detection circuit, and said input signal of said amplifying circuit in a predetermined ratio; and
a relative peak detection circuit to generate, in accordance with said divided voltage signal, said threshold level from a maximum level relative to said absolute minimum level detected by said absolute bottom detection circuit.

26. A signal amplifying circuit as claimed in claim 25, wherein said relative peak detection circuit includes a capacitor, to hold said relative maximum level, having a reference terminal connected to an output terminal of said absolute bottom detection circuit.

27. A signal amplifying circuit as claimed in claim 25, wherein said absolute bottom detection circuit includes a capacitor, to hold said absolute minimum level, having a reference terminal connected to a prescribed reference level line.

28. A signal amplifying circuit comprising:
an automatic threshold control circuit to supply a threshold level;
a reproduction circuit to discriminate an input signal of said signal amplifying circuit using the threshold level supplied from said automatic threshold control circuit;
a photodetector to convert an optical signal into an electric current signal; and
a preamplifier to amplify said electric current signal and output a corresponding output signal that is the input signal of said signal amplifying circuit, wherein said automatic threshold control circuit comprises:
an absolute bottom detection circuit to detect an absolute minimum level of said input signal of said signal amplifying circuit;
a voltage divider circuit to generate a divided voltage signal by dividing said absolute minimum level, detected by said absolute bottom detection circuit, and said input signal of said signal amplifying circuit in a predetermined ratio; and
a relative peak detection circuit to generate, in accordance with said divided voltage signal, said threshold level from a maximum level relative to said absolute minimum level detected by said absolute bottom detection circuit.

29. A signal amplifying circuit comprising:
a level-rise following automatic threshold control circuit which follows a rise in an input signal;
a level-fall following automatic threshold control circuit which follows a fall in said input signal;
a discrimination circuit which performs discrimination between a rise and a fall in a DC level of said input signal, based on detection levels from said level-rise following automatic threshold control circuit and said level-fall following automatic threshold control circuit;
a selection circuit which selects a threshold level generated by said level-rise following automatic threshold control circuit or said level-fall following automatic threshold control circuit, in accordance with an output from said discrimination circuit; and
a reproduction circuit which discriminates said input signal by using said threshold level.

30. A signal amplifying circuit as claimed in claim 29, wherein said level-rise following automatic threshold control circuit comprises:
an absolute peak detection circuit for detecting an absolute maximum level of said input signal;
a relative bottom detection circuit for detecting, in accordance with said input signal, a minimum level relative to the maximum level detected by said absolute peak detection circuit; and
a voltage divider circuit for generating said threshold level by dividing said absolute maximum level and said relative minimum level in a predetermined ratio.

31. A signal amplifying circuit as claimed in claim 30, wherein in said relative bottom detection circuit, a reference terminal of a capacitor for holding said relative minimum level is connected to an output terminal of said absolute peak detection circuit.

32. A signal amplifying circuit as claimed in claim 30, wherein in said absolute peak detection circuit, a reference terminal of a capacitor for holding said absolute maximum level is connected to a prescribed reference level line.

33. A signal amplifying circuit as claimed in claim 29, wherein said level-rise following automatic threshold control circuit comprises:
an absolute peak detection circuit for detecting an absolute maximum level of said input signal;
a voltage divider circuit for generating a divided voltage signal by dividing said absolute maximum level, detected by said absolute peak detection circuit, and said input signal in a predetermined ratio; and a relative bottom detection circuit for generating, in accordance with said divided voltage signal, said threshold level from a minimum level relative to said absolute maximum level detected by said absolute peak detection circuit.

34. A signal amplifying circuit as claimed in claim 33, wherein in said relative bottom detection circuit, a reference terminal of a capacitor for holding said relative minimum level is connected to an output terminal of said absolute peak detection circuit.

35. A signal amplifying circuit as claimed in claim 33, wherein in said absolute peak detection circuit, a reference terminal of a capacitor for holding said absolute maximum level is connected to a prescribed reference level line.

36. A signal amplifying circuit as claimed in claim 29, wherein said level-fall following automatic threshold control circuit comprises:

an absolute bottom detection circuit for detecting an absolute minimum level of said input signal;

a relative peak detection circuit for detecting, in accordance with said input signal, a maximum level relative to the minimum level detected by said absolute bottom detection circuit; and a voltage divider circuit for generating said threshold level by dividing said absolute minimum level and said relative maximum level in a predetermined ratio.

37. A signal amplifying circuit as claimed in claim 36, wherein in said relative peak detection circuit, a reference terminal of a capacitor for holding said relative maximum level is connected to an output terminal of said absolute bottom detection circuit.

38. A signal amplifying circuit as claimed in claim 36, wherein in said absolute bottom detection circuit, a reference terminal of a capacitor for holding said absolute minimum level is connected to a prescribed reference level line.

39. A signal amplifying circuit as claimed in claim 29, wherein said level-fall following automatic threshold control circuit comprises:

an absolute bottom detection circuit for detecting an absolute minimum level of said input signal;

a voltage divider circuit for generating a divided voltage signal by dividing said absolute minimum level, detected by said absolute bottom detection circuit, and said input signal in a predetermined ratio; and a relative peak detection circuit for generating, in accordance with said divided voltage signal, said threshold level from a maximum level relative to said absolute minimum level detected by said absolute bottom detection circuit.

40. A signal amplifying circuit as claimed in claim 39, wherein in said relative peak detection circuit, a reference terminal of a capacitor for holding said relative maximum level is connected to an output terminal of said absolute bottom detection circuit.

41. A signal amplifying circuit as claimed in claim 39, wherein in said absolute bottom detection circuit, a reference terminal of a capacitor for holding said absolute minimum level is connected to a prescribed reference level line.

42. A signal amplifying circuit as claimed in claim 29, wherein said discrimination circuit comprises a comparator for comparing peak detection outputs of said level-rise following automatic threshold control circuit and said level-fall following automatic threshold control circuit, and wherein when the output level of said level-rise following automatic threshold control circuit is higher than the output level of said level-fall following automatic threshold control circuit by more than a predetermined level, it is determined that the DC level is falling.

43. A signal amplifying circuit as claimed in claim 29, wherein said discrimination circuit comprises a comparator for comparing bottom detection outputs of said level-rise following automatic threshold control circuit and said level-fall following automatic threshold control circuit, and wherein when the output level of said level-fall following automatic threshold control circuit is lower than the output level of said level-rise following automatic threshold control circuit by more than a predetermined level, it is determined that the DC level is rising.

44. A signal amplifying circuit as claimed in claim 29, wherein said discrimination circuit comprises an A/D conversion circuit for digitizing peak and bottom detection levels or threshold levels supplied from said level-rise following automatic threshold control circuit and said level-fall following automatic threshold control circuit, and a logic operation circuit for comparing said digitized detection levels.

45. A signal amplifying circuit as claimed in claim 29, wherein said signal amplifying circuit further comprises a photodetector for converting an optical signal into an electric current signal, and a preamplifier for amplifying said electric current signal as a voltage signal, wherein signal amplification is performed by taking said voltage signal as an input signal.

46. An automatic threshold control circuit, comprising:

an absolute peak detection circuit to detect an absolute maximum level of an input signal; and a relative bottom detection circuit to detect a minimum level of the input signal relative to the absolute maximum level detected by the absolute peak detection circuit, wherein the relative bottom detection circuit is interlocked to the absolute peak detection circuit to retain a constant potential difference between the absolute maximum level and the minimum level.

47. An automatic threshold control circuit, comprising:

an absolute bottom detection circuit to detect an absolute minimum level of an input signal; and a relative peak detection circuit to detect a maximum level of the input signal relative to the absolute minimum level detected by the absolute bottom detection circuit, wherein the relative peak detection circuit is interlocked to the absolute bottom detection circuit to retain a constant potential difference between the absolute minimum level and the maximum level.

* * * * *